(12) United States Patent
Masumitsu et al.

(10) Patent No.: US 11,901,700 B2
(45) Date of Patent: Feb. 13, 2024

(54) DRIVING DEVICE, DRIVING METHOD, AND LIGHT-EMITTING UNIT

(71) Applicant: Sony Semiconductor Solutions Corporation, Kanagawa (JP)

(72) Inventors: Naoki Masumitsu, Kagoshima (JP);
Katsuhisa Daio, Kagoshima (JP);
Akihito Kamiegawa, Kagoshima (JP);
Takeshi Yuwaki, Kagoshima (JP);
Shouichi Kuroki, Kagoshima (JP);
Masatoshi Kitada, Kagoshima (JP);
Hayato Kamizuru, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 993 days.

(21) Appl. No.: 16/639,657

(22) PCT Filed: Aug. 10, 2018

(86) PCT No.: PCT/JP2018/030019
§ 371 (c)(1),
(2) Date: Feb. 17, 2020

(87) PCT Pub. No.: WO2019/039312
PCT Pub. Date: Feb. 28, 2019

(65) Prior Publication Data
US 2020/0176951 A1 Jun. 4, 2020

(30) Foreign Application Priority Data

Aug. 24, 2017 (JP) .................................. 2017-160847

(51) Int. Cl.
*H01S 5/068* (2006.01)
*G01S 7/481* (2006.01)
(Continued)

(52) U.S. Cl.
CPC .......... *H01S 5/06804* (2013.01); *G01S 7/484* (2013.01); *G01S 7/4816* (2013.01);
(Continued)

(58) Field of Classification Search
CPC .. H01S 5/022; H01S 5/02208; H01S 5/02257; H01S 5/0608; H01S 5/068;
(Continued)

(56) References Cited

U.S. PATENT DOCUMENTS 5,796,767 A 8/1998 Aizawa
2005/0174099 A1 8/2005 Ohkubo et al.
(Continued)

FOREIGN PATENT DOCUMENTS

CN 201007441 Y 1/2008
CN 101911406 A 12/2010
(Continued)

OTHER PUBLICATIONS

KR 2016-0132963 (English translation) (Year: 2016).*
(Continued)

*Primary Examiner* — Xinning(Tom) Niu
*Assistant Examiner* — Delma R Fordé
(74) *Attorney, Agent, or Firm* — Michael Best & Friedrich LLP

(57) ABSTRACT

The present invention relates to a driving device, a driving method, and a light-emitting unit that make it possible to appropriately drive a light-emitting element.
The driving device according to the present invention includes: a setting section (161) that sets at least one of a bias current of a light-emitting element (an LD 121) or a target current for setting output light from the light-emitting element (the LD 121) to desired intensity on the basis of a result of detection of an offset light amount when the light-emitting element (the LD 121) does not emit light; and an output
(Continued)

controller (164) that controls an output of a driving current of the light-emitting element (the LD 121) on the basis of at least one of the set bias current or the set target current. The detection of the offset light amount is performed by a light-receiving element (a PD 122) that receives a portion of the output light.

The present invention is applicable to a ranging module, for example.

19 Claims, 31 Drawing Sheets

(51) Int. Cl.
    *G01S 7/484*    (2006.01)
    *G01S 7/4865*   (2020.01)
    *G01S 17/08*    (2006.01)
    *G01S 17/89*    (2020.01)
    *G01S 17/93*    (2020.01)
    *G01S 17/14*    (2020.01)

(52) U.S. Cl.
    CPC ............ *G01S 7/4865* (2013.01); *G01S 17/08* (2013.01); *G01S 17/89* (2013.01); *G01S 17/14* (2020.01); *G01S 17/93* (2013.01)

(58) Field of Classification Search
    CPC ............ H01S 5/06808; H01S 5/06825; H01S 5/0683; G01S 17/88; G01S 17/89; G01S 17/894; G01S 17/93; G01S 17/08; G01S 7/497; G01S 7/484; G01S 7/4865; G01S 7/4868

See application file for complete search history.

(56) References Cited

U.S. PATENT DOCUMENTS

| | | |
|---|---|---|
| 2009/0016394 A1 | 1/2009 | Kanno |
| 2011/0006188 A1 | 1/2011 | Lin |
| 2011/0221847 A1 | 9/2011 | Takezawa |
| 2014/0341243 A1 | 11/2014 | Sumino |

FOREIGN PATENT DOCUMENTS

| | | |
|---|---|---|
| EP | 1298449 A2 | 4/2003 |
| JP | 6466695 A | 3/1989 |
| JP | 07-147446 A | 6/1995 |
| JP | 07-294248 A | 11/1995 |
| JP | 11-298077 A | 10/1999 |
| JP | 11-304470 A | 11/1999 |
| JP | 2011-198877 A | 10/2011 |
| KR | 20100097682 A | 9/2010 |
| KR | 20160132963 A | 11/2016 |
| WO | 0150640 A | 7/2001 |
| WO | WO-2017005490 A | 1/2017 |

OTHER PUBLICATIONS

KR20100097682 (English translation) (Year: 2010).*
Extended European Search Report dated Jul. 31, 2020 for corresponding European Application No. 18848327.5.

* cited by examiner

[FIG. 31]
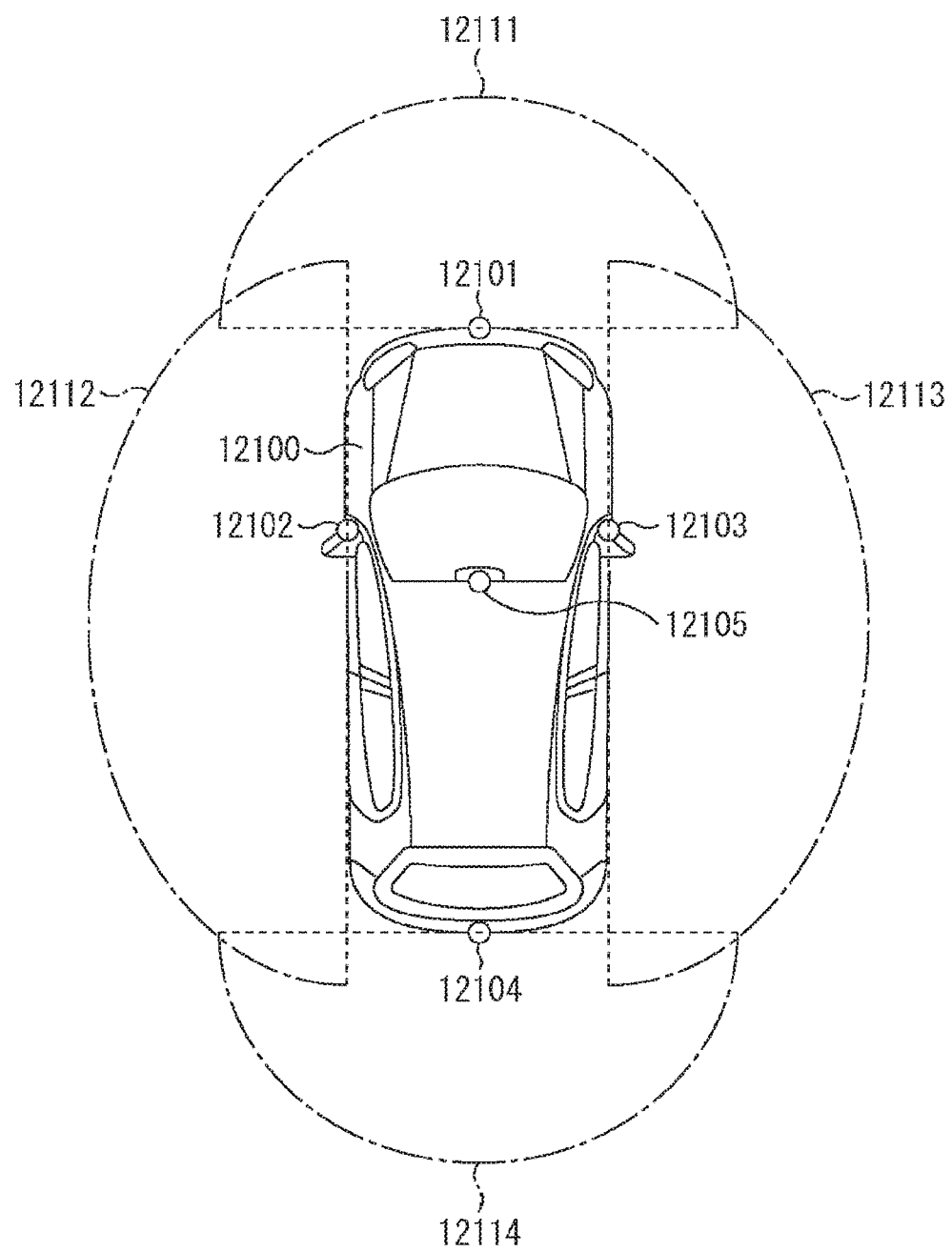

DRIVING DEVICE, DRIVING METHOD, AND LIGHT-EMITTING UNIT

TECHNICAL FIELD

The present technology relates to a driving device, a driving method, and a light-emitting unit, and particularly to a driving device, a driving method, and a light-emitting unit that make it possible to appropriately drive a light-emitting element.

BACKGROUND ART

It has been proposed that a relational expression between a bias current of a laser diode (LD) and light-receiving power be found on the basis of two types of bias currents having different near-threshold current values and light-receiving power detected by a light-receiving element in a case where the LD is caused to emit light by the two types of bias currents. Furthermore, it has been proposed that a current value when the light-receiving power is zero in the found relational expression be calculated as a threshold current of the LD (for example, see PTL 1).

CITATION LIST

Patent Literature

PTL 1: Japanese Unexamined Patent Application Publication No. H7-147446

SUMMARY OF THE INVENTION

However, the invention of PTL 1 does not take into consideration the influence of background light, such as light from the outside.

For example, in a laser printer or an optical disk unit, an LD is installed inside a chassis, and thus there exists little background light around the LD.

Meanwhile, in a ranging module using the time of flight (ToF), an LD is installed in a position that allows laser light to be outputted to the outside, and thus there exists background light around the LD. Accordingly, even when the LD does not yet emit light, light-receiving power detected by a light-receiving element does not become zero. Therefore, in a case where a threshold current of the LD is calculated by means of the invention of PTL 1, the influence of background light causes an error in a calculation result. Then, because of this error, there is a possibility that the LD may not be driven appropriately.

The present technology has been made in view of such circumstances, and is intended to make it possible to appropriately drive a light-emitting element such as an LD.

A driving device according to a first aspect of the present technology includes: a setting section that sets at least one of a bias current of a light-emitting element or a target current for setting output light from the light-emitting element to desired intensity on the basis of a result of detection of an offset light amount when the light-emitting element does not emit light, the detection being performed by a light-receiving element that receives a portion of the output light; and an output controller that controls an output of a driving current of the light-emitting element on the basis of at least one of the set bias current or the set target current.

A driving method according to the first aspect of the present technology implemented by a driving device includes: setting at least one of a bias current of a light-emitting element or a target current for setting output light from the light-emitting element to desired intensity on the basis of a result of detection of an offset light amount when the light-emitting element does not emit light, the detection being performed by a light-receiving element that receives a portion of the output light; and controlling an output of a driving current of the light-emitting element on the basis of at least one of the set bias current or the set target current.

A light-emitting unit according to a second aspect of the present technology includes: a light-emitting element; a light-receiving element that receives a portion of output light from the light-emitting element; a setting section that sets at least one of a bias current of the light-emitting element or a target current for setting the output light to desired intensity on the basis of a result of detection of an offset light amount when the light-emitting element does not emit light, the detection being performed by the light-receiving element; and an output controller that controls an output of a driving current of the light-emitting element on the basis of at least one of the set bias current or the set target current.

In the first or second aspect of the present technology, at least one of the bias current of the light-emitting element or the target current for setting the output light to desired intensity is set on the basis of the result of detection of the offset light amount when the light-emitting element does not emit light. The detection is performed by the light-receiving element that receives a portion of the output light from the light-emitting element. Additionally, the output of the driving current of the light-emitting element is controlled on the basis of at least one of the set bias current or the set target current.

According to the first or second aspect of the present technology, it is possible to appropriately set at least one of the bias current of the light-emitting element or the target current. Furthermore, according to the first or second aspect of the present technology, it is possible to appropriately drive the light-emitting element.

It is to be noted that the effects described here are not necessarily limitative, and may be any of effects described in the present disclosure.

BRIEF DESCRIPTION OF DRAWINGS

FIG. 31 is a diagram of assistance in explaining an example of installation positions of an outside-vehicle information detecting section and an imaging section.

MODES FOR CARRYING OUT THE INVENTION

Some embodiments of the present technology are described below. Description is given in the following order.
1. Embodiments
2. Modification Examples
3. Others

1. Embodiments

<Configuration Example of Ranging Module>

Figure 1:
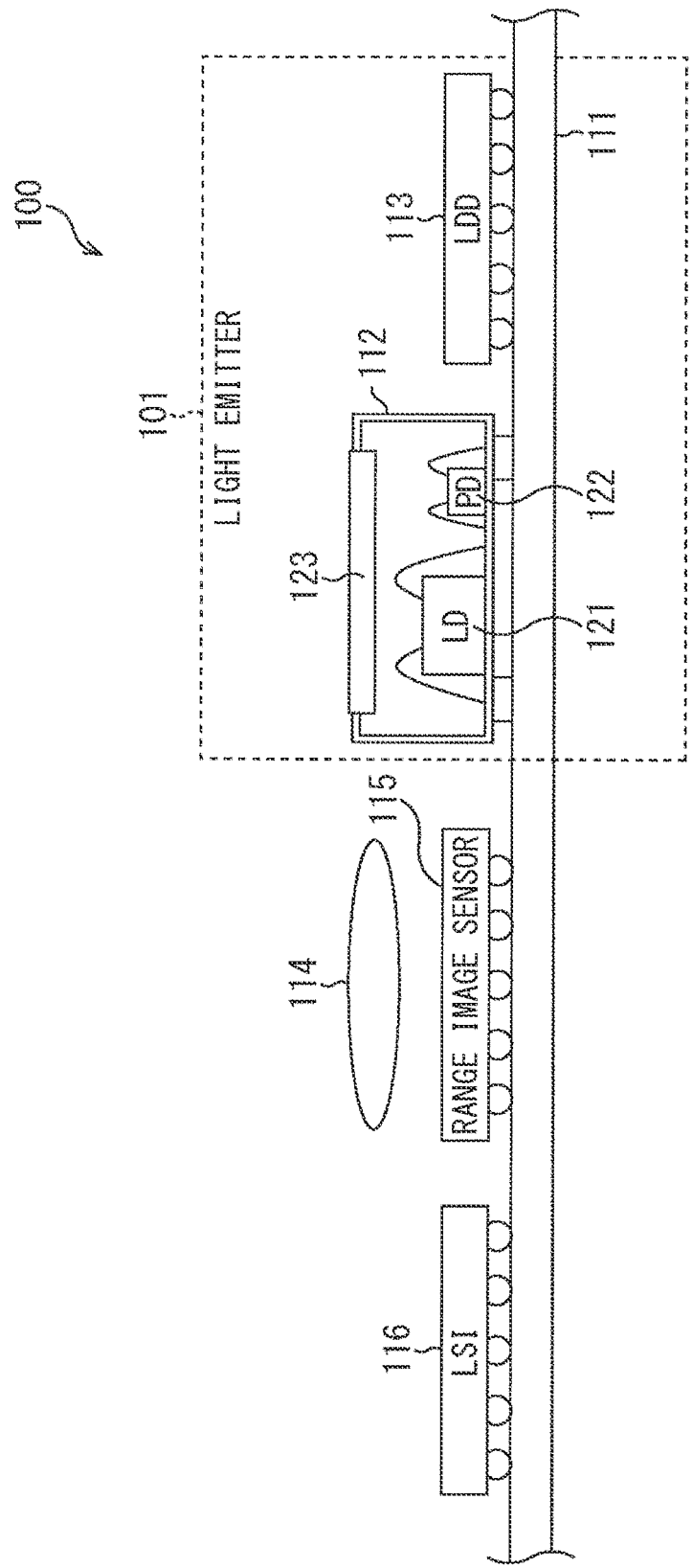
FIG. 1 is a block diagram illustrating an embodiment of a ranging module to which the present technology is applied.

FIG. 1 illustrates an embodiment of a ranging module to which the present technology is applied.

A ranging module 100 is a module that measures a distance to an object using laser light by a ToF method. The ranging module 100 includes a substrate 111, an optical module 112, a laser diode driver (LDD) 113, a lens 114, a range image sensor 115, and an LSI 116. The optical module 112, the LDD 113, the lens 114, the range image sensor 115, and the LSI 116 are mounted on the substrate 111. Furthermore, the optical module 112 and the LDD 113 form a light emitter 101 that performs emission of laser light.

The optical module 112 includes a laser diode (LD) 121, a photodiode (PD) 122, and a diffuser 123.

The LD 121 is a light-emitting element that outputs laser light of a predetermined wavelength. For example, under control of the LDD 113, the LD 121 outputs laser light to be used for measurement of a distance to an object.

The PD 122 is a light-receiving element used for measurement of the intensity (power) of laser light outputted from the LD 121, and outputs a received light signal indicating an amount of received light. For example, the PD 122 receives return light that is a portion of the laser light outputted from the LD 121 and returning by being reflected by the diffuser 123, and outputs a received light signal indicating an amount of the return light.

The diffuser 123 is a diffusing member provided for the purpose of making laser light outputted from the LD 121 meet a safety standard, such as IEC (International Electrotechnical Commission) 60825-1. The laser light outputted from the LD 121 passes through the diffuser 123 thereby being diffused, and becomes diffused light. Furthermore, a portion of the laser light is reflected by the diffuser 123, and its return light enters the PD 122.

The LDD 113 supplies a driving current to the LD 121, thereby controlling light emission of the LD 121. Furthermore, the LDD 113 performs auto power control (APC) to control the intensity (power) of laser light outputted from the LD 121 on the basis of a received light signal from the PD 122.

When laser light is applied from the LD 121 to an object subjected to distance measurement, the lens 114 forms an image of reflected light reflected on and returned from the object on a light-receiving surface of the range image sensor 115.

The range image sensor 115 is, for example, a ToF range image sensor, and detects a distance (a depth) to a subject on a pixel to pixel basis. More specifically, the range image sensor 115 detects a phase difference between laser light outputted from the LD 121 and reflected light from the subject on a pixel to pixel basis, and supplies range image data indicating the detected phase difference to the LSI 116.

The LSI 116 controls the LDD 113 and the range image sensor 115, and performs various processing, such as detection of a distance to a subject, on the basis of range image data.

It is to be noted that the disposition of the optical module 112, the LDD 113, the lens 114, the range image sensor 115, and the LSI 116 on the substrate 111 illustrated in FIG. 1 is an example, and may be changed as appropriate.

<Configuration Example of LDD>

Figure 2:
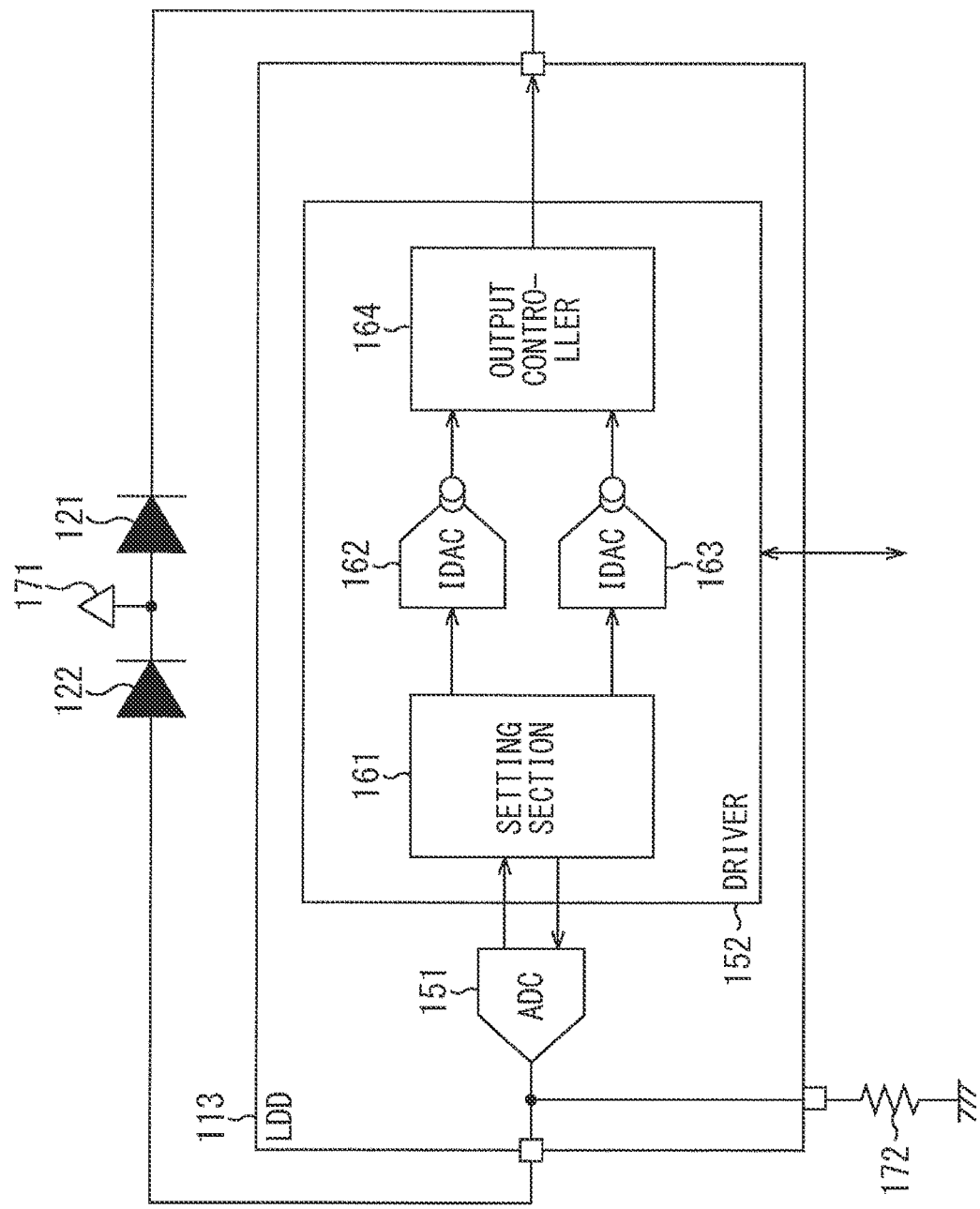
FIG. 2 is a block diagram illustrating a configuration example of an LDD.

FIG. 2 illustrates a configuration example of the LDD 113 illustrated in FIG. 1. The LDD 113 includes an A/D converter (ADC) 151 and a driver 152. The driver 152 includes a setting section 161, a current output D/A converter (IDAC) 162, an IDAC 163, and an output controller 164.

It is to be noted that an anode of the LD 121 and a cathode of the PD 122 are coupled to a power source 171 of a predetermined voltage. That is, in this example, the LD 121 is an anode common. Furthermore, an input terminal of the ADC 151 is grounded through a resistance 172.

The ADC 151 performs an A/D conversion of a received light signal supplied from the PD 122, and supplies a digital received light signal to the setting section 161.

The setting section 161 performs the settings for a switching current and a bias current to be supplied to the LD 121 on the basis of a received light signal from the ADC 151 under control of the LSI 116. The setting section 161 supplies the IDAC 162 with a digital input signal indicating a value of a switching current to be outputted from the IDAC 162. Furthermore, the setting section 161 supplies the IDAC 163 with a digital input signal indicating a value of a bias current to be outputted from the IDAC 163.

The IDAC 162 performs a D/A conversion of an input signal, and generates a switching current having a value indicated by the input signal, and then supplies the switching current to the output controller 164.

The IDAC 163 performs a D/A conversion of an input signal, and generates a bias current having a value indicated by the input signal, and then supplies the bias current to the output controller 164.

The output controller 164 controls the output of a driving current to the LD 121. For example, under control of the LSI 116, the output controller 164 amplifies a switching current, and generates a pulsed driving current having a peak at a value in which the amplified switching current and a bias current are added up, and then supplies the driving current to the LD 121.

<Functional Configuration Example of LSI>

Figure 3:
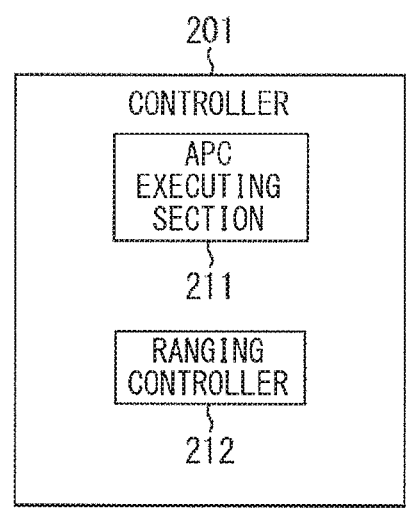
FIG. 3 is a block diagram illustrating a functional configuration example of an LSI.

FIG. 3 illustrates a functional configuration example of the LSI 116 illustrated in FIG. 1. The LSI 116 implements functions including a controller 201. The controller 201 includes an APC executing section 211 and a ranging controller 212.

The APC executing section 211 controls the LDD 113, thereby performing APC to adjust the intensity of laser light outputted from the LD 121.

The ranging controller 212 controls the distance measurement made by the ranging module 100. More specifically, the ranging controller 212 controls the LDD 113 and the range image sensor 115, thereby controlling a process of applying laser light to an object and acquiring range image data.

<APC Execution Processing>

Subsequently, APC execution processing performed by the ranging module 100 is described with reference to a flowchart of FIG. 4 and a timing chart of FIG. 5. It is to be noted that this processing is performed, for example, before the distance measurement each time a distance measurement is made by the ranging module 100.

At Step S1, the ranging module 100 performs a background light measuring process. Here, details of the background light measuring process are described with reference to a flowchart of FIG. 6. It is to be noted that this process is performed in a BG segment illustrated in FIG. 5.

At Step S101, the LDD 113 puts the LD 121 into a non-light-emitting state. Specifically, under control of the APC executing section 211, the setting section 161 sets respective values of input signals to the IDAC 162 and the IDAC 163 to cause respective values of a switching current and a bias current to be zero. Thus, a value of a driving current supplied to the LD 121 becomes zero, and the LD 121 goes into a non-light-emitting state.

At Step S102, the LDD 113 detects and holds an offset light amount PD_BG. Specifically, the ADC 151 converts a received light signal from the PD 122 when the LD 121 is in a non-light-emitting state from analog to digital, and supplies the converted received light signal to the setting section 161. The setting section 161 holds a value of the received light signal at this time as an offset light amount PD_BG.

Figure 7:
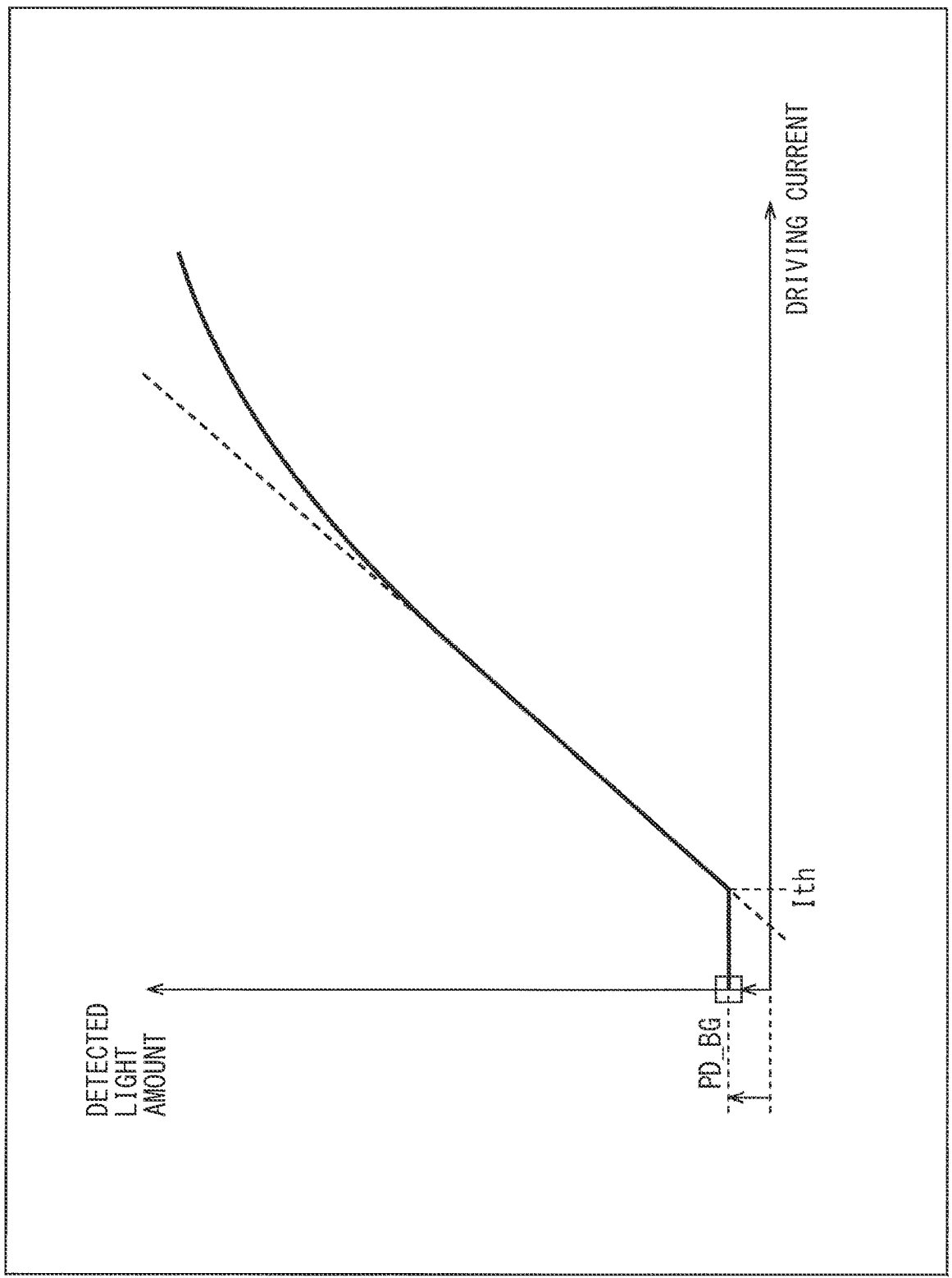
FIG. 7 is a graph for explaining the details of the background light measuring process.

FIG. 7 is a graph illustrating an example of light-emitting characteristics of the LD 121. In FIG. 7, the horizontal axis indicates a driving current of the LD 121, and the vertical axis indicates an amount of light detected by the PD 122. FIG. 7 illustrates a relationship between the driving current of the LD 121 and the amount of light detected by the PD 122 (the emission intensity of the LD 121).

The LD 121 does not emit light when the driving current is less than a threshold current Ith, and emits light when the driving current becomes equal to or more than the threshold current Ith.

Furthermore, in a segment from when the driving current has become equal to or more than the threshold current Ith until the driving current reaches a certain level (hereinafter, referred to as a linear segment), the emission intensity (emission power) of the LD 121 changes substantially linearly with respect to the driving current. Therefore, the amount of light detected by the PD 122 changes substantially linearly with respect to the driving current in the linear segment.

Meanwhile, when the driving current becomes higher and exceeds the linear segment, the emission intensity of the LD 121 changes non-linearly with respect to the driving current. Specifically, an amount of change in the emission intensity of the LD 121 with respect to the driving current becomes smaller than that in the linear segment. It is to be noted that a segment in which the driving current has exceeded the linear segment is referred to as a non-linear segment.

Furthermore, the PD 122 receives ambient background light, such as light from the outside, besides return light of the laser light. Thus, the amount of light detected by the PD 122 does not become zero even when the LD 121 does not yet emit light. Therefore, the offset light amount PD_BG indicates an amount of background light detected by the PD 122.

After the process at Step S102, the background light measuring process ends.

To return to FIG. 4, at Step S2, the ranging module 100 performs APC1. Here, details of the APC1 are described with reference to a flowchart of FIG. 8. It is to be noted that this process is performed in an APC1 section illustrated in FIG. 5.

At Step S131, the LDD 113 causes the LD 121 to emit light with a bias current ILD_L1. Specifically, under control of the APC executing section 211, the setting section 161 sets respective values of input signals to the IDAC 162 and the IDAC 163 to cause the value of the switching current to be zero and the value of the bias current to be ILD_L1. Thus, a bias current having a value of ILD_L1 (hereinafter, referred to as a bias current ILD_L1) is supplied to the LD 121, and the LD 121 emits light.

Figure 9:
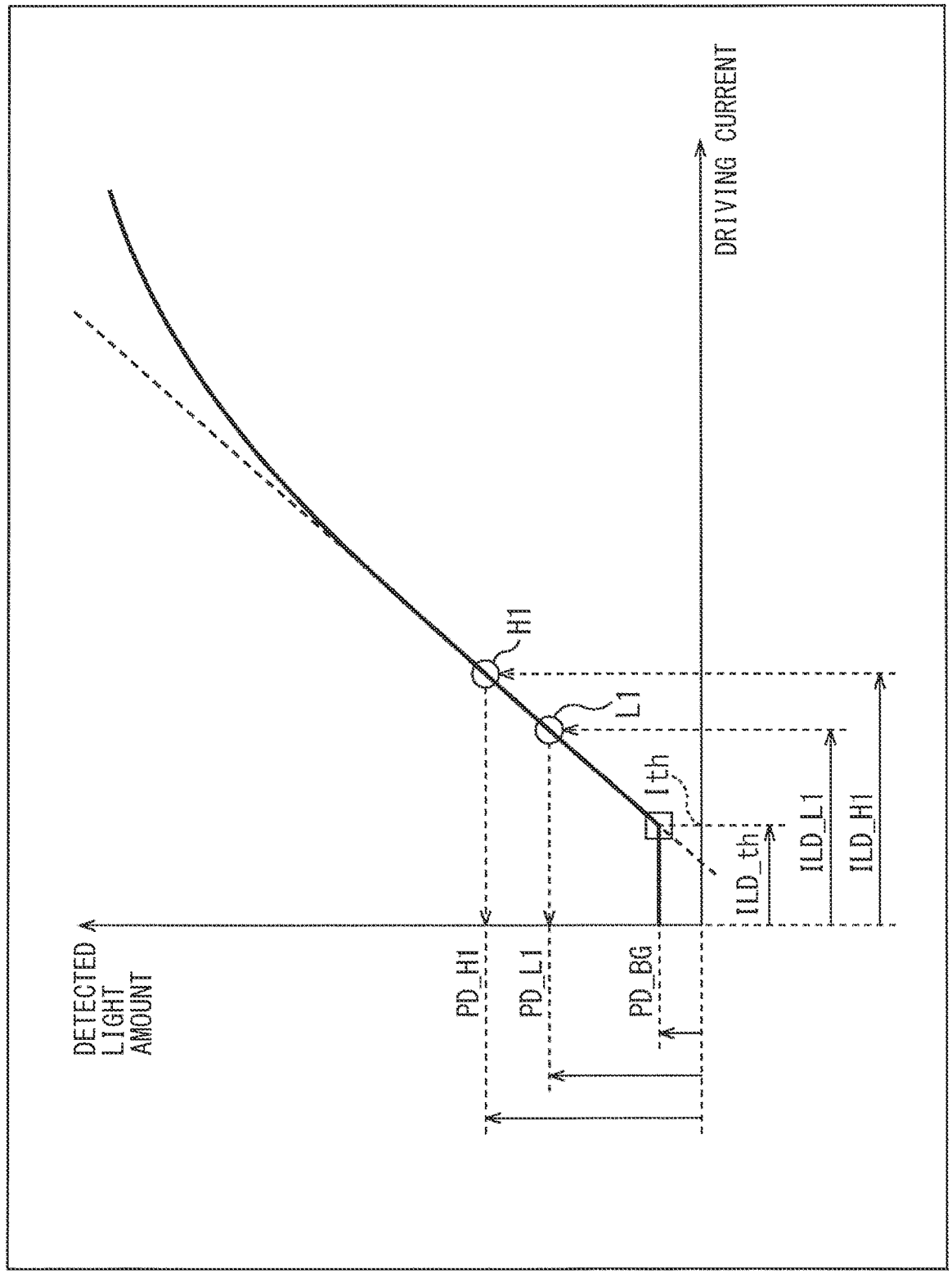
FIG. 9 is a graph for explaining the details of the APC1.

FIG. 9 illustrates a relationship between the driving current of the LD 121 and the amount of light detected by the PD 122, as with FIG. 7. The bias current ILD_L1 is set, for example, to a value that is near the threshold current Ith of the LD 121 and is larger than the threshold current Ith in the linear segment. It is to be noted that in the APC execution processing, for example, a pre-calculated design value (for example, a catalogue value) is used as the threshold current Ith.

At Step S132, the LDD 113 detects and holds a sample light amount PD_L1. Specifically, the ADC 151 converts a received light signal from the PD 122 from analog to digital, and supplies the converted received light signal to the setting section 161. The setting section 161 holds a value of the received light signal at this time as a sample light amount PD_L1. As illustrated in FIG. 9, the sample light amount PD_L1 is an amount of light detected by the PD 122 when the LD 121 emits light with the bias current ILD_L1.

At Step S133, the LDD 113 causes the LD 121 to emit light with a bias current ILD_H1. Specifically, under control of the APC executing section 211, the setting section 161 sets respective values of input signals to the IDAC 162 and the IDAC 163 to cause the value of the switching current to be zero and the value of the bias current to be ILD_H1. Thus, a bias current having a value of ILD_H1 (hereinafter, referred to as a bias current ILD_H1) is supplied to the LD 121, and the LD 121 emits light.

As illustrated in FIG. 9, the value of the bias current ILD_H1 is set, for example, to a value that is near the threshold current Ith and is larger than the bias current ILD_L1 in the linear segment.

At Step S134, a sample light amount PD_H1 is detected and held through a process similar to Step S132. As illustrated in FIG. 9, the sample light amount PD_H1 is an amount of light detected by the PD 122 when the LD 121 emits light with the bias current ILD_H1.

At Step S135, the setting section 161 calculates a bias current ILD_th.

As described above, the bias current ILD_L1 and the bias current ILD_H1 are included in the linear segment. Accordingly, as illustrated in FIG. 9, the setting section 161 performs a 2-point interpolation function using a point L1 corresponding to the bias current ILD_L1 and the sample light amount PD_L1 and a point H1 corresponding to the bias current ILD_H1 and the sample light amount PD_H1, thereby calculating a bias current ILD_th corresponding to the offset light amount PD_BG. A value of this bias current ILD_th is approximately equal to the threshold current Ith, and thus the accuracy of the bias current is improved.

It is to be noted that the bias current ILD_th may be calculated by an interpolation process using, for example, three or more sample light amounts in a case where the LD 121 is caused to emit light by three or more bias currents having different values.

At Step S136, the setting section 161 determines whether or not the bias current ILD_th is within an expected range. That is, a result of the calculation of the bias current ILD_th is checked. For example, the setting section 161 compares the bias current ILD_th with the threshold current Ith, and, in a case where a difference between the two is equal to or less than a predetermined determination value, determines that the bias current ILD_th is within the expected range, and the process moves on to Step S137.

At Step S137, the setting section 161 stores the bias current ILD_th.

After that, the APC1 ends.

Meanwhile, at Step S136, in a case where a difference between the bias current ILD_th and the threshold current Ith exceeds the predetermined determination value, the setting section 161 determines that the bias current ILD_th is out of the expected range, and the process moves on to Step S138.

At Step S138, the LDD 113 performs error processing.

For example, the setting section 161 supplies an error signal to the APC executing section 211. Furthermore, for example, under control of the APC executing section 211, the setting section 161 sets respective values of input signals to the IDAC 162 and the IDAC 163 to zero. Thus, the value of the driving current supplied to the LD 121 becomes zero, and the LD 121 goes into a non-light-emitting state.

After that, the distance measurement is not performed, and the APC execution processing ends.

To return to FIG. 4, at Step S3, the ranging module 100 performs APC2. Here, details of the APC2 are described with reference to a flowchart of FIG. 10. It is to be noted that this process is performed in an APC2 segment illustrated in FIG. 5.

At Step S161, the LDD 113 causes the LD 121 to emit light with a switching current ILD_L2. Specifically, under control of the APC executing section 211, the setting section 161 sets respective values of input signals to the IDAC 162 and the IDAC 163 to cause the value of the switching current to be ILD_L2 and the value of the bias current to be ILD_th. Thus, a pulsed driving current in which a switching current having a value of ILD_L2 (hereinafter, referred to as a switching current ILD_L2) and the bias current ILD_th are added up is supplied to the LD 121, and the LD 121 emits light.

Figure 11:
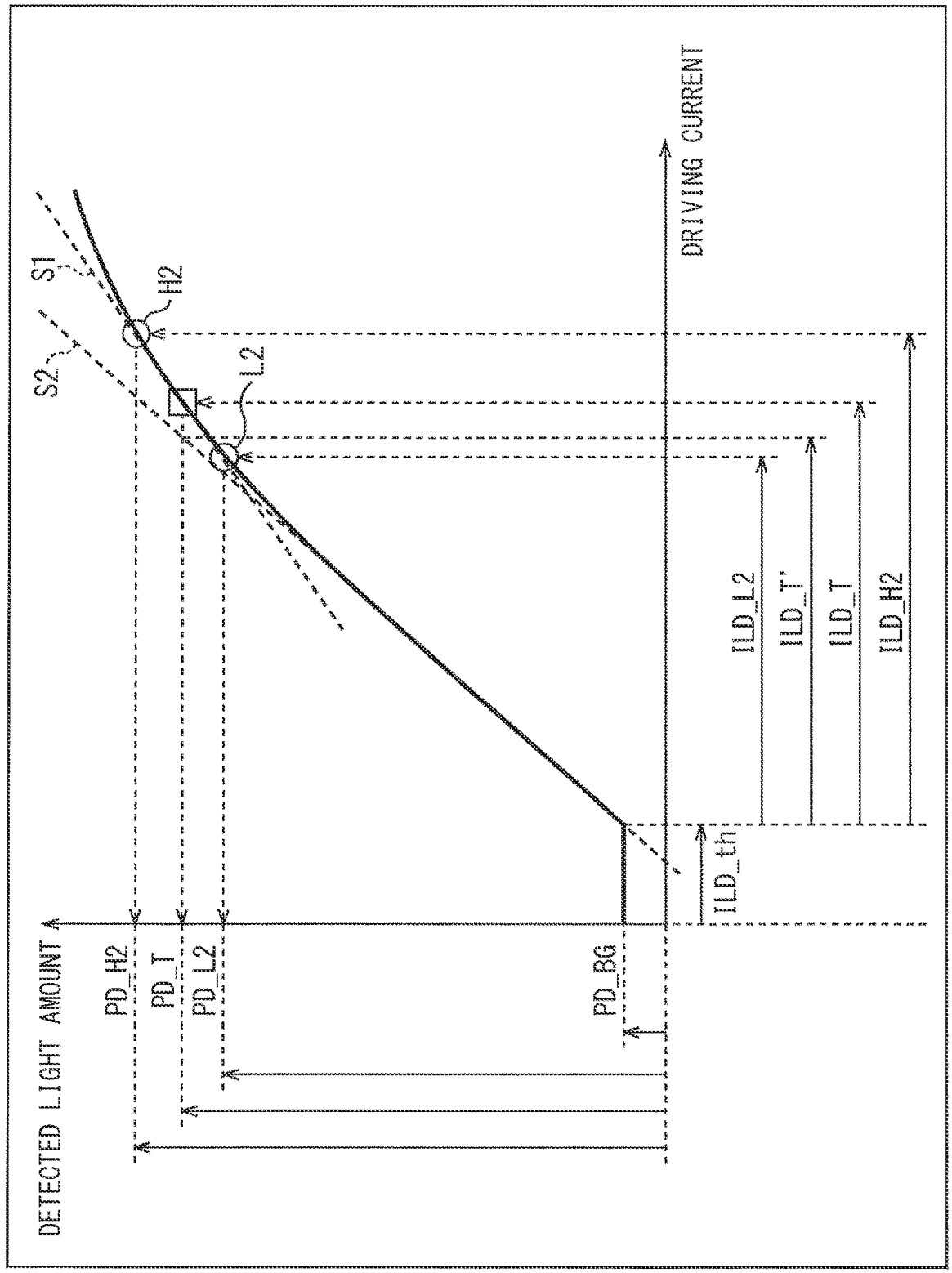
FIG. 11 is a graph for explaining the details of the APC2.

FIG. 11 illustrates a relationship between the driving current of the LD 121 and the amount of light detected by the PD 122, as with FIG. 7.

The ranging module 100 needs to apply laser light to a distant object and receive its reflected light; therefore, the desired intensity (hereinafter, referred to as the target intensity) of laser light from the LD 121 used at the time of distance measurement becomes very high. Therefore, a driving current for causing laser light of the target intensity to be outputted from the LD 121 exceeds the linear segment and is included in the non-linear segment.

Accordingly, the switching current ILD_L2 is set within the non-linear segment. More specifically, for example, the switching current ILD_L2 is set to a value smaller than a virtual target current ILD_T' in the non-linear segment.

The virtual target current ILD_T' here is a virtual value of a switching current for causing laser light of the target intensity to be outputted from the LD 121 (a current that the bias current ILD_th is subtracted from the driving current). For example, a value of a switching current with respect to a target light amount PD_T calculated on the basis of a straight line S2 based on the assumption that also in the non-linear segment, the emission intensity of the LD 121 changes linearly with respect to the driving current is set as a virtual target current ILD_T'.

Furthermore, the target light amount PD_T is an amount of light detected by the PD 122 when laser light of the target intensity is outputted from the LD 121, and is found in advance, for example, by an actual measurement or calculation.

Figure 10:
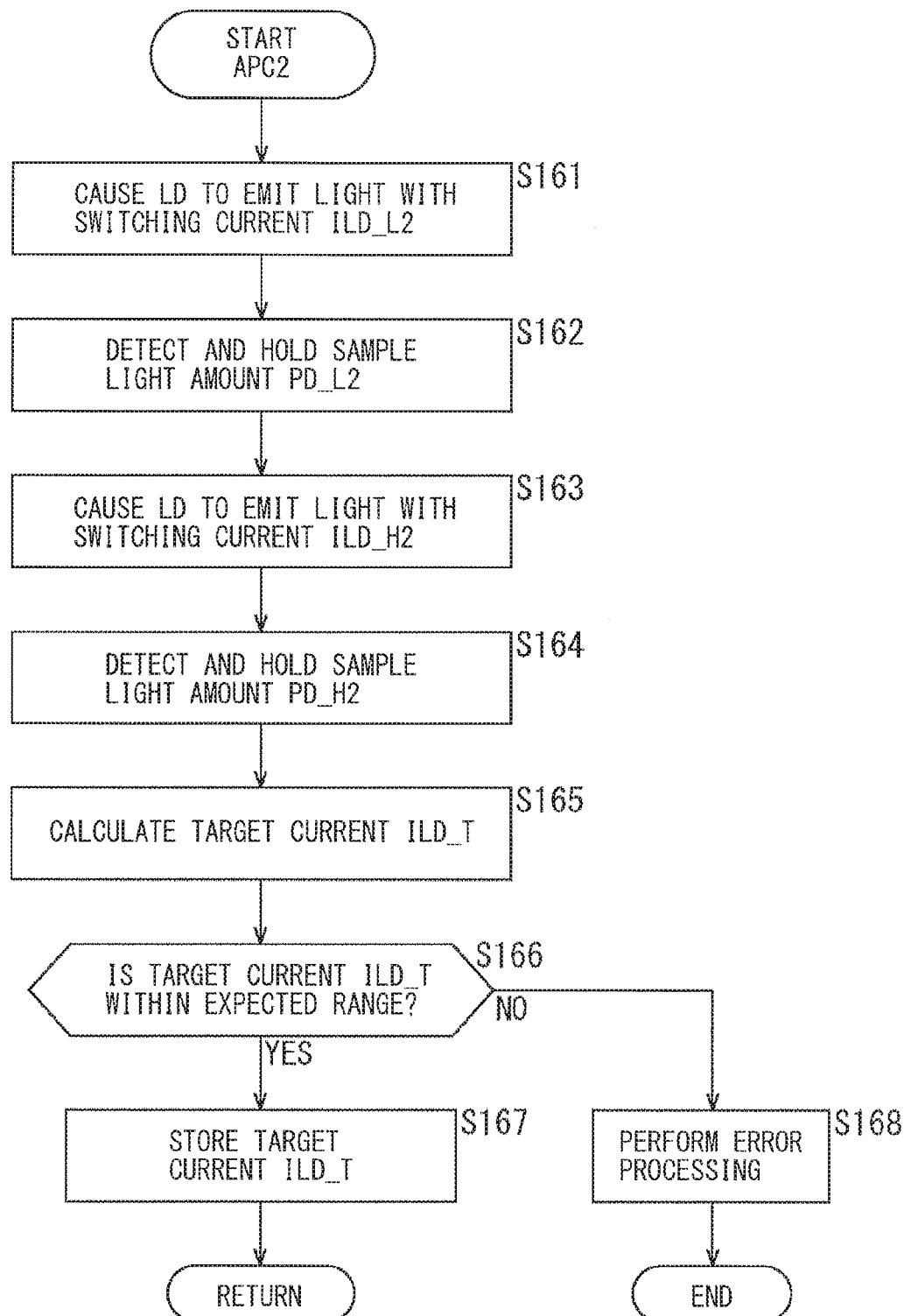
FIG. 10 is a flowchart for explaining details of APC2.

At Step S162, a sample light amount PD_L2 is detected and held through a process similar to Step S132 illustrated in FIG. 10. As illustrated in FIG. 11, the sample light amount PD_L2 is an amount of light detected by the PD 122 when the LD 121 emits light with a driving current in which the switching current ILD_L2 and the bias current ILD_th are added up.

At Step S163, the LDD 113 causes the LD 121 to emit light with a switching current ILD_H2. Specifically, under control of the APC executing section 211, the setting section 161 sets respective values of input signals to the IDAC 162 and the IDAC 163 to cause the value of the switching current to be ILD_H2 and the value of the bias current to be ILD_th. Thus, a pulsed driving current in which a switching current having a value of ILD_H2 (hereinafter, referred to as a switching current ILD_H2) and the bias current ILD_th are added up is supplied to the LD 121, and the LD 121 emits light.

As illustrated in FIG. 11, the switching current ILD_H2 is set, for example to a value that is near the virtual target current ILD_T' and is larger than the virtual target current ILD_T' in the non-linear segment.

At Step S164, a sample light amount PD_H2 is detected and held through a process similar to Step S132 illustrated in FIG. 10. As illustrated in FIG. 11, the sample light amount PD_H2 is an amount of light detected by the PD 122 when the LD 121 emits light with a driving current in which the switching current ILD_H2 and the bias current ILD_th are added up.

At Step S165, the setting section 161 calculates a target current ILD_T. For example, as illustrated in FIG. 11, the setting section 161 performs a 2-point interpolation function using a point L2 corresponding to the switching current ILD_L2 and the sample light amount PD_L2 and a point H2 corresponding to the switching current ILD_H2 and the sample light amount PD_H2, thereby calculating a target current ILD_T that is a switching current corresponding to the target light amount PD_T.

Thus, the target current ILD_T is calculated on the basis of a straight line S1 connecting the point L2 and the point H2. Therefore, the accuracy of the target current is improved as compared with, for example, the virtual target current ILD_T' calculated on the basis of the straight line S2 based on the assumption that the emission intensity of the LD 121 changes linearly with respect to the driving current also in the non-linear segment.

It is to be noted that the target current ILD_T may be calculated by an interpolation process using, for example, three or more sample light amounts in a case where the LD 121 is caused to emit light by three or more switching currents having different values.

At Step S166, the setting section 161 determines whether or not the target current ILD_T is within an expected range. That is, a result of the calculation of the target current ILD_T is checked. For example, the setting section 161 compares the target current ILD_T with the virtual target current ILD_T', and, in a case where a difference between the two is equal to or less than a predetermined determination value, determines that the target current ILD_T is within the expected range, and the process moves on to Step S167.

At Step S167, the setting section 161 stores the target current ILD_T.

After that, the APC2 ends.

Meanwhile, at Step S166, in a case where a difference between the target current ILD_T and the virtual target current ILD_T' exceeds the predetermined determination value, the setting section 161 determines that the target current ILD_T is out of the expected range, and the process moves on to Step S168.

Figure 8:
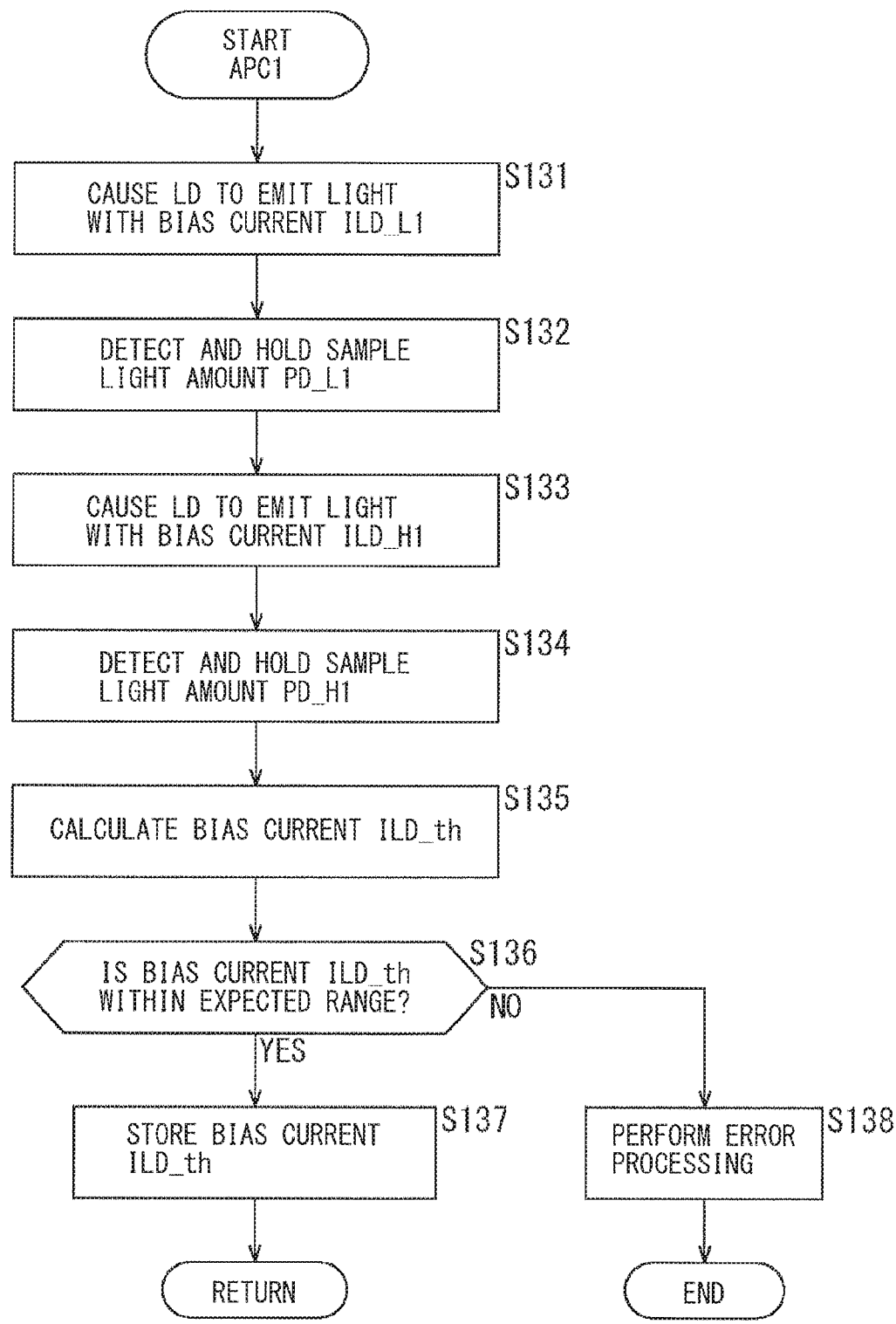
FIG. 8 is a flowchart for explaining details of APC1.

At Step S168, error processing is performed as with the process at Step S138 illustrated in FIG. 8.

After that, the distance measurement is not performed, and the APC execution processing ends.

To return to FIG. 4, at Step S4, the ranging module 100 performs an APC1 emission checking process. Here, details of the APC1 emission checking process are described with reference to a flowchart of FIG. 12. It is to be noted that this process is performed in an APC1 emission checking segment illustrated in FIG. 5.

At Step S191, under control of the APC executing section 211, the LDD 113 causes the LD 121 to emit light with a bias current ILD_th. For example, under control of the APC executing section 211, the setting section 161 sets respective values of input signals to the IDAC 162 and the IDAC 163 to cause the value of the switching current to be zero and the value of the bias current to be ILD_th. Thus, a bias current having a value of ILD_th (hereinafter, referred to as a bias current ILD_th) is supplied to the LD 121, and the LD 121 emits light.

At Step S192, a test light amount PD1_CHK is detected and held through a process similar to Step S132 illustrated in FIG. 10.

Figure 13:
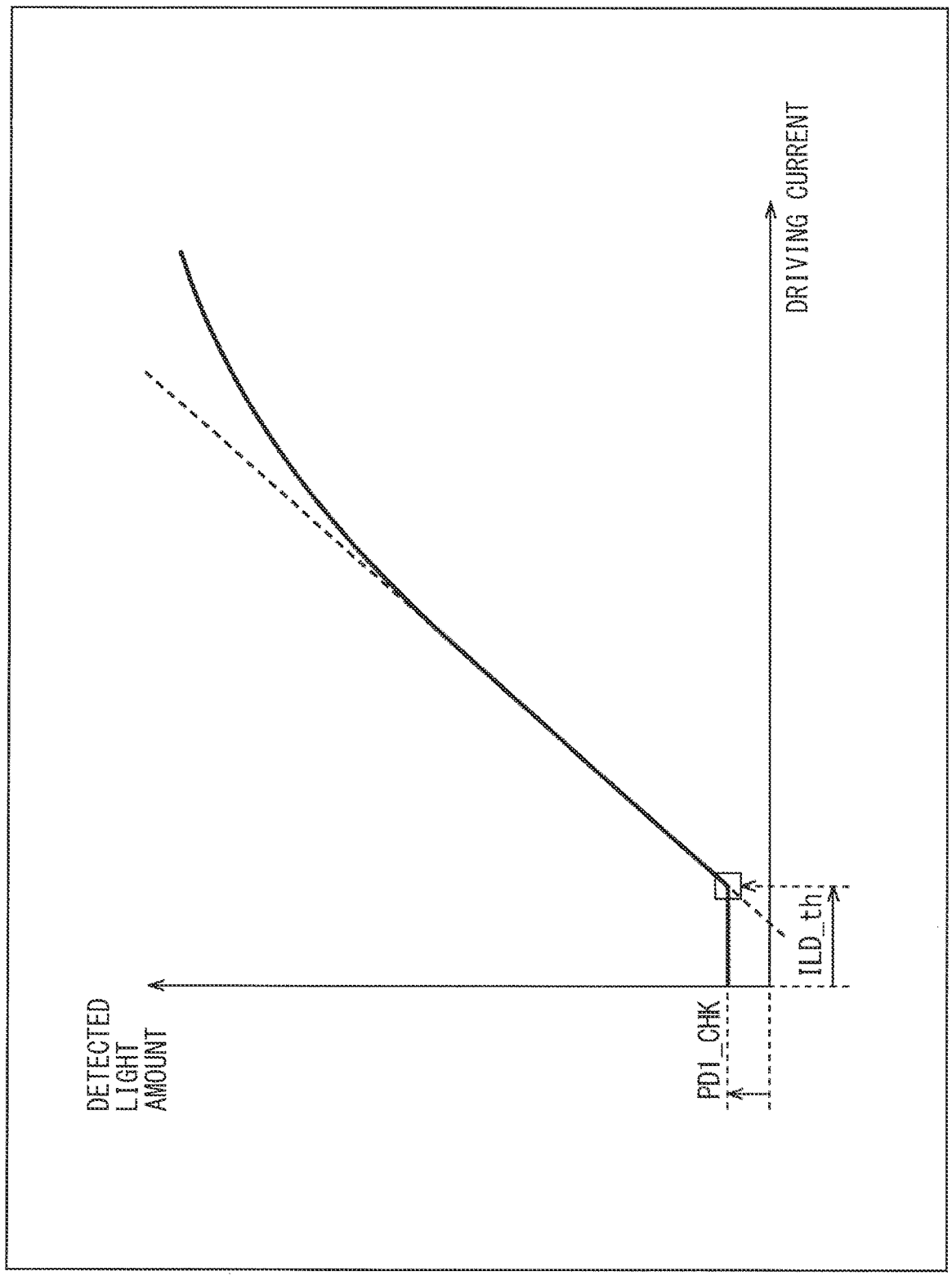
FIG. 13 is a graph for explaining the details of the APC1 emission checking process.

FIG. 13 illustrates a relationship between the driving current of the LD 121 and the amount of light detected by the PD 122, as with FIG. 7. The test light amount PD1_CHK is an amount of light detected by the PD 122 when the LD 121 emits light with the bias current ILD_th.

At Step S193, the setting section 161 determines whether or not a difference between the test light amount PD1_CHK and the offset light amount PD_BG is equal to or less than a determination value. Through this determination process, the accuracy of the bias current ILD_th set by the APC1 is checked. For example, in a case where it has been determined that a difference between the two is equal to or less than the predetermined determination value, i.e., in a case where the accuracy of the bias current ILD_th is high, the process moves on to Step S194.

At Step S194, the setting section 161 determines a bias current. That is, the setting section 161 determines the bias current ILD_th set by the APC1 to be a bias current of the LD 121.

After that, the APC1 emission checking process ends.

Meanwhile, at Step S193, in a case where it has been determined that a difference between the two exceeds the predetermined determination value, i.e., in a case where the accuracy of the bias current ILD_th is low, the process moves on to Step S195.

At Step S195, error processing is performed as with the process at Step S138 illustrated in FIG. 8.

After that, the distance measurement is not performed, and the APC execution processing ends.

To return to FIG. 4, at Step S5, the ranging module 100 performs an APC2 emission checking process. Here, details of the APC2 emission checking process are described with reference to a flowchart of FIG. 14. It is to be noted that this process is performed in an APC2 emission checking section illustrated in FIG. 5.

At Step S221, under control of the APC executing section 211, the LDD 113 causes the LD 121 to emit light with a target current ILD_T. For example, under control of the APC executing section 211, the setting section 161 sets respective values of input signals to the IDAC 162 and the IDAC 163 to cause the value of the switching current to be ILD_T and the value of the bias current to be ILD_th. Thus, a pulsed driving current in which a switching current having a value of ILD_T (the target current ILD_T) and the bias current ILD_th are added up is supplied to the LD 121, and the LD 121 emits light.

At Step S222, a test light amount PD2_CHK is detected and held through a process similar to Step S132 illustrated in FIG. 10.

Figure 15:
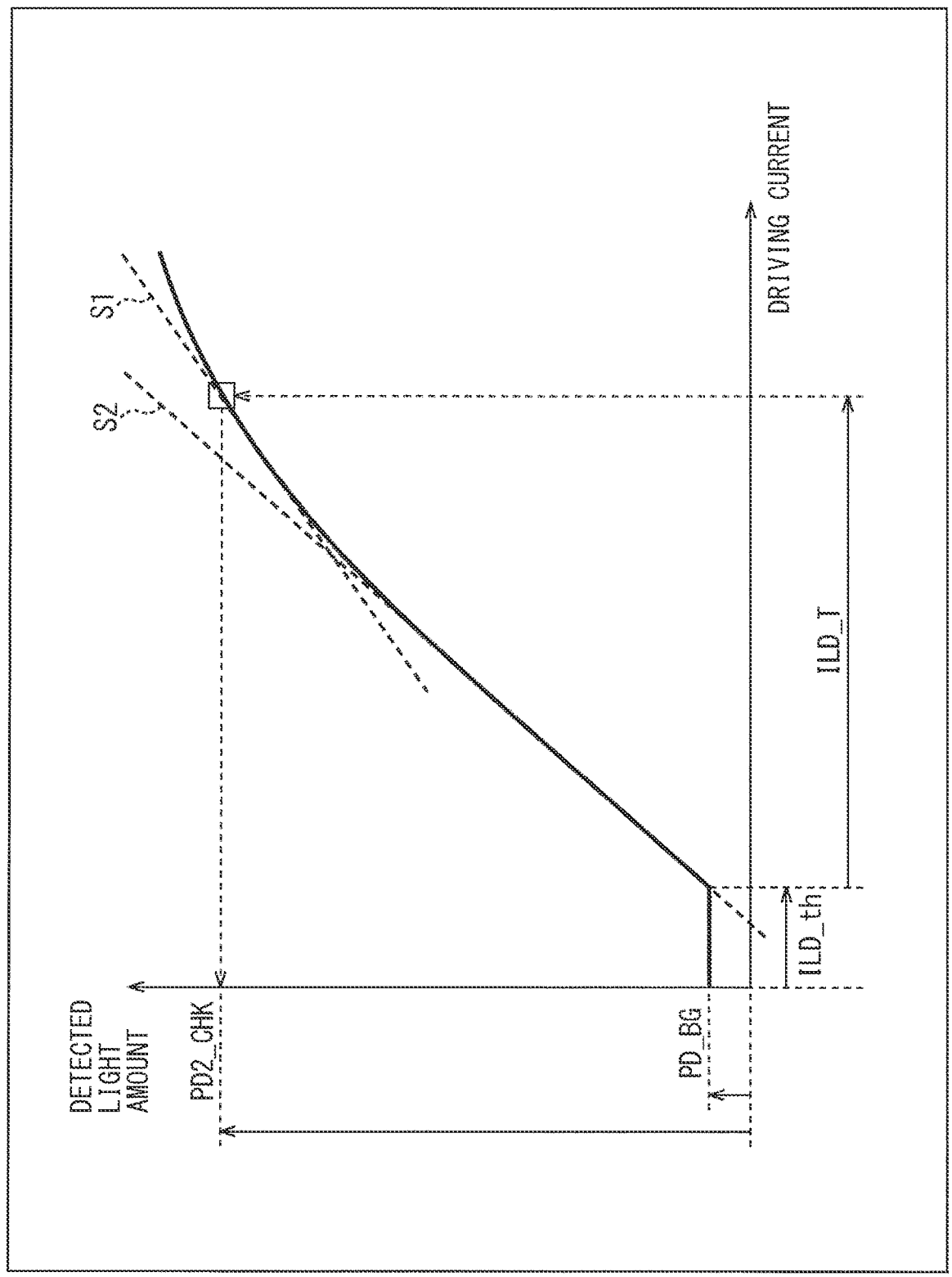
FIG. 15 is a graph for explaining the details of the APC2 emission checking process.

FIG. 15 illustrates a relationship between the driving current of the LD 121 and the amount of light detected by the PD 122, as with FIG. 7. The test light amount PD2_CHK is an amount of light detected by the PD 122 when the LD 121 emits light with the driving current in which the target current ILD_T and the bias current ILD_th are added up.

At Step S223, the setting section 161 determines whether or not a difference between the test light amount PD2_CHK and the offset light amount PD_BG is equal to or less than a determination value. Through this determination process, abnormality of the diffuser 123 (for example, installation failure, damage, etc. of the diffuser 123) is detected.

Figure 16:
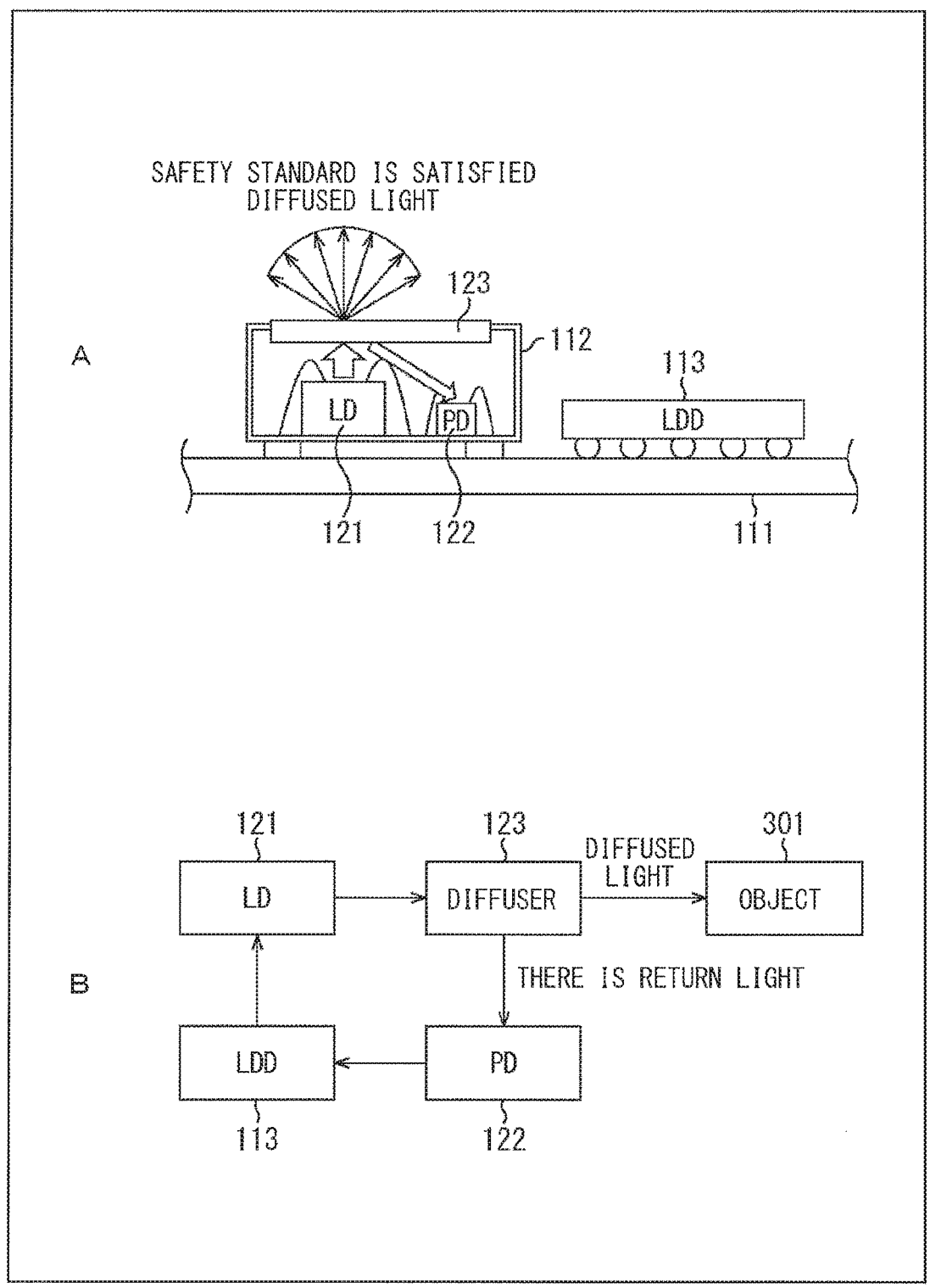
FIG. 16 is a diagram for explaining a method of detecting abnormality of a diffuser.

For example, as illustrated in parts A and B of FIG. 16, in a case where the diffuser 123 is installed properly, return light of the laser light from the LD 121 enters the PD 122. Therefore, the test light amount PD2_CHK becomes approximately equal to an amount of light in which the return light and background light are added up. As a result, a difference between the test light amount PD2_CHK and the offset light amount PD_BG becomes larger and exceeds the predetermined determination value.

In this case, the laser light outputted from the LD 121 is made into diffused light by the diffuser 123, and is reduced in intensity and then is applied to an object 301. Therefore, the laser light outputted from the optical module 112 is able to meet a predetermined safety standard.

Figure 17:
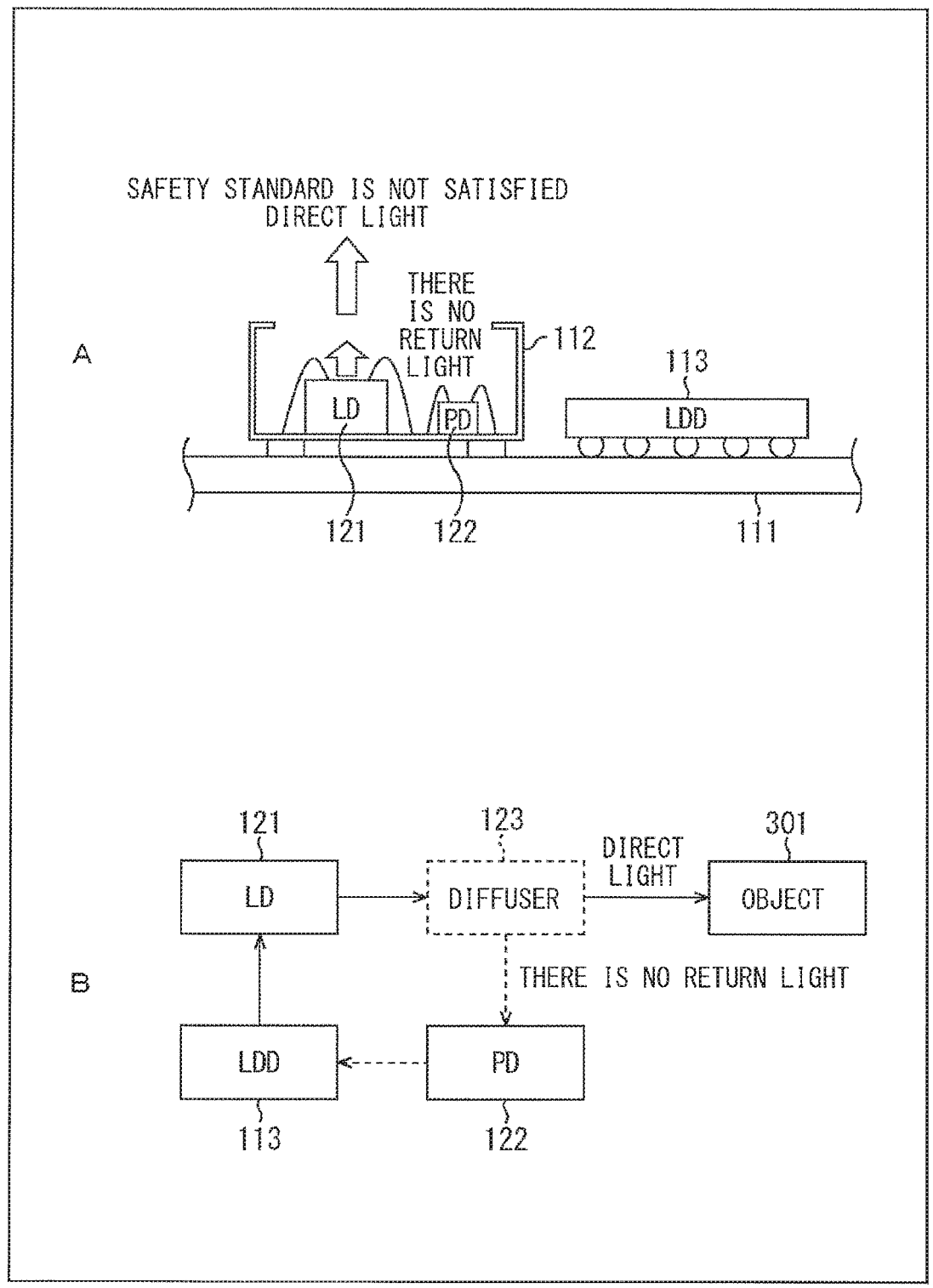
FIG. 17 is a diagram for explaining a method of detecting abnormality of the diffuser.

Meanwhile, as illustrated in parts A and B of FIG. 17, in a case where the diffuser 123 is removed, return light of the laser light from the LD 121 does not enter the PD 122. Therefore, the test light amount PD2_CHK becomes approximately equal to an amount of background light. As a result, the test light amount PD2_CHK and the offset light amount PD_BG are approximately equal, and thus a difference between the two is equal to or less than the predetermined determination value.

In this case, the laser light outputted from the LD 121 is directly applied to the object 301 without being reduced in intensity. Therefore, there is a possibility that the laser light outputted from the optical module 112 may not meet the predetermined safety standard.

Then, in a case where it has been determined that a difference between the test light amount PD2_CHK and the offset light amount PD_BG exceeds the predetermined determination value, i.e., in a case where there is no abnormality of the diffuser 123, the process moves on to Step S224.

At Step S224, the setting section 161 determines whether or not a difference between the test light amount PD2_CHK and the target light amount PD_T is equal to or less than a determination value. Through this determination process, the accuracy of the target current ILD_T set by the APC2 is checked. For example, in a case where it has been determined that a difference between the two is equal to or less than the predetermined determination value, i.e., in a case where the accuracy of the target current ILD_T is high, the process moves on to Step S225.

At Step S225, the setting section 161 determines a target current. That is, the setting section 161 determines the target current ILD_T set by the APC2 to be a switching current of the LD 121 at the time of distance measurement.

After that, the APC2 emission checking process ends.

Meanwhile, at Step S224, in a case where it has been determined that a difference between the test light amount PD2_CHK and the target light amount PD_T exceeds the predetermined determination value, i.e., in a case where the accuracy of the target current ILD_T is low, the process moves on to Step S226.

Furthermore, at Step S223, in a case where it has been determined that a difference between the test light amount PD2_CHK and the offset light amount PD_BG is equal to or less than the predetermined determination value, i.e., in a case where there is assumed to be abnormality of the diffuser 123, the process moves on to Step S226.

At Step S226, error processing is performed as with the process at Step S138 illustrated in FIG. 8. Thus, for example, in a case where the diffuser 123 is removed, laser light that does not meet the safety standard is prevented from being applied to the human eyes, etc.

After that, the distance measurement is not performed, and the APC execution processing ends.

To return to FIG. 4, at Step S6, the ranging module 100 starts the distance measurement.

After that, the APC execution processing ends.

As described above, it is possible to appropriately set the driving current (the bias current and the target current) of the LD 121 before the distance measurement.

Figure 18:
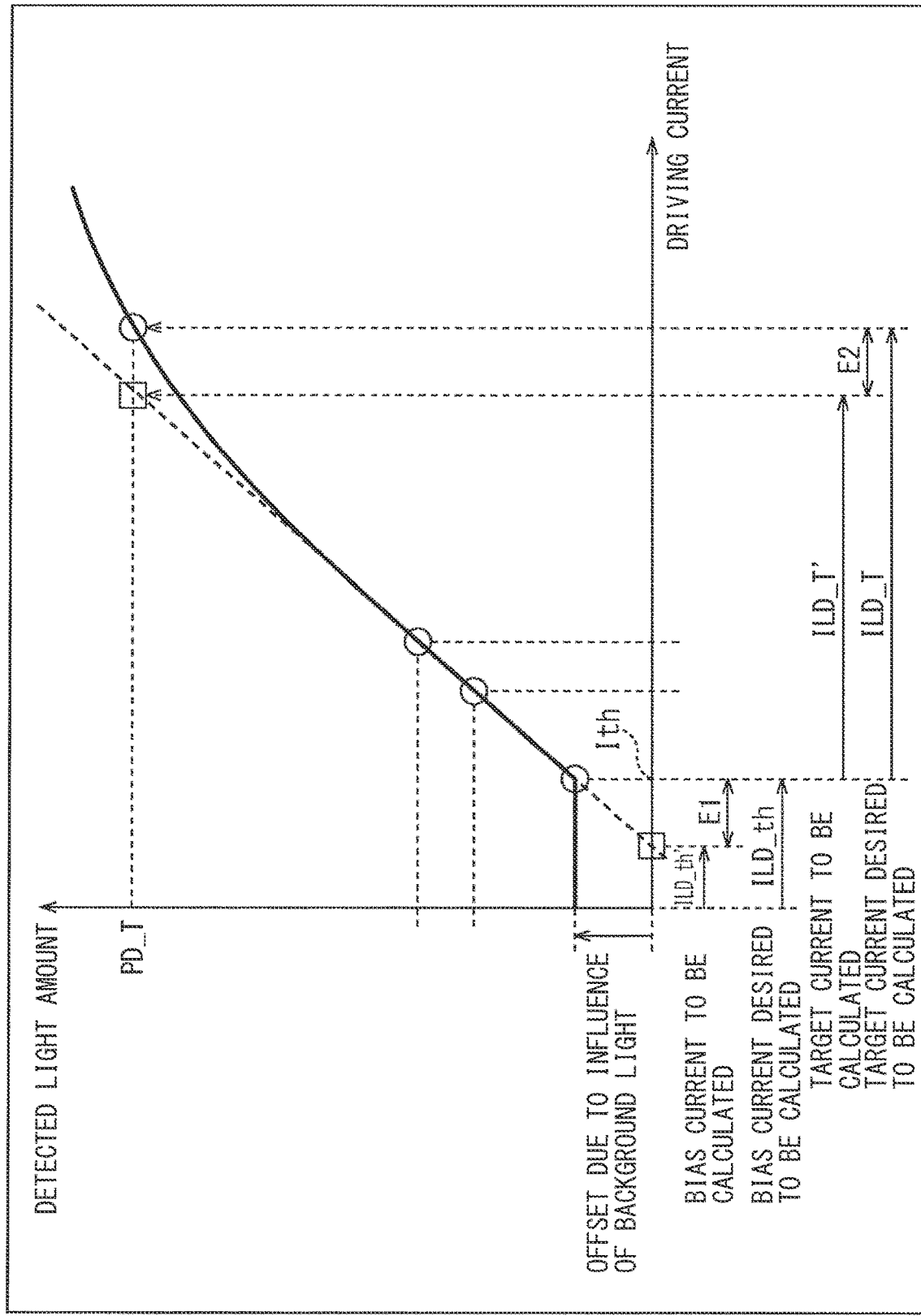
FIG. 18 is a diagram for explaining errors in a bias current and a target current.

For example, as illustrated in FIG. 18, in a case where the influence of background light is not taken into consideration, a bias current ILD_th' that is a current when the amount of light detected by the PD 122 becomes zero is calculated. As a result, there is an error E1 between the bias current ILD_th' and the threshold current Ith of the LD 121.

Furthermore, for example, as illustrated in FIG. 18, in a case where the non-linear segment of the LD 121 is not taken into consideration, a target current ILD_T' (the same current as the above-described virtual target current ILD_T') with respect to the target intensity of the LD 121 is calculated. As a result, there is an error E2 between the target current ILD_T' and a target current calculated in a case where the non-linear segment is taken into consideration.

Figure 19:
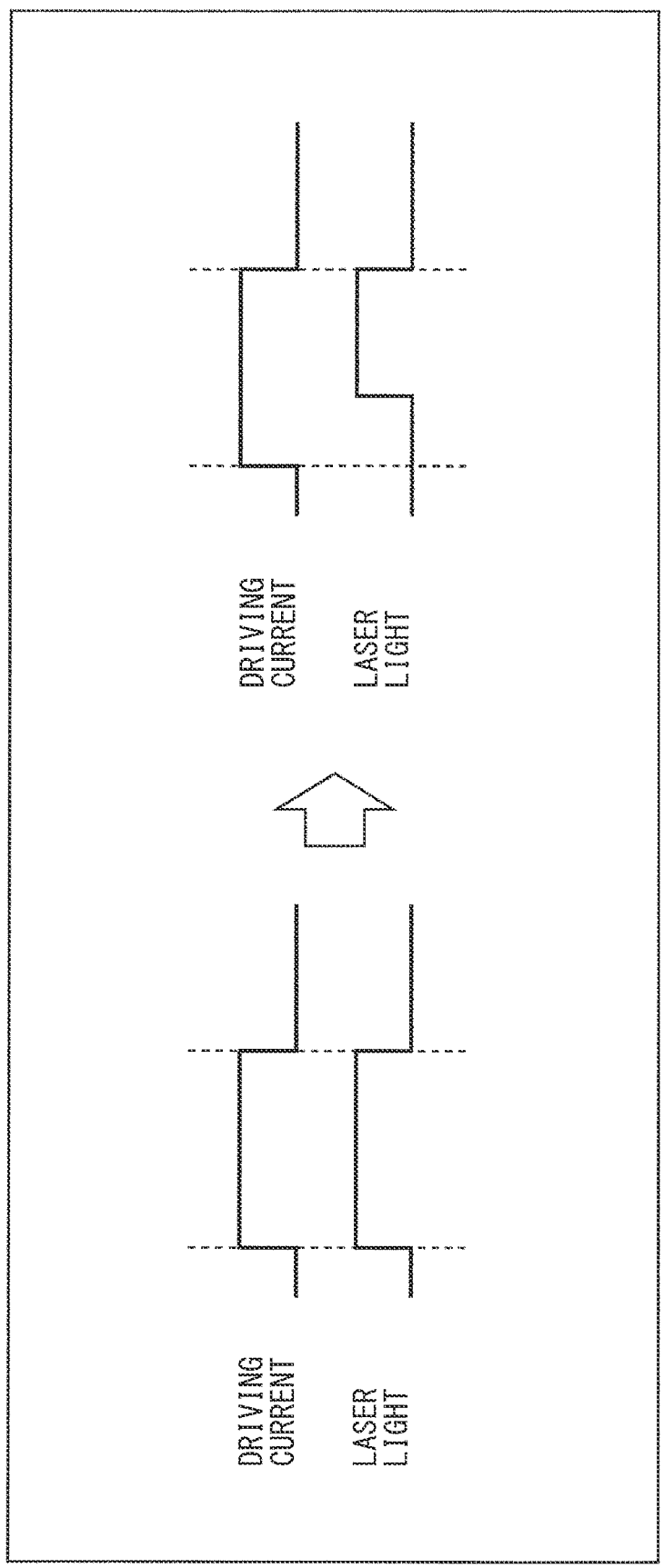
FIG. 19 is a diagram for explaining a delay in light emission due to the errors in the bias current and the target current.

Then, due to these errors in the bias current and the target current, there is a possibility that a delay in light emission of the LD 121 may occur, for example, as illustrated in FIG. 19. That is, the timing for the LD 121 to emit light with respect to the driving current is delayed, and the pulse width of the laser light becomes narrower than the pulse width of the driving current. As a result, there is a possibility that the accuracy of the distance measurement may be reduced.

Meanwhile, in the ranging module 100, the influence of background light and the non-linear segment of the LD 121 are taken into consideration, and the accuracy of setting the bias current and the target current of the LD 121 is improved. As a result, the LD 121 is appropriately driven, and the delay in light emission of the LD 121 is suppressed, and therefore the accuracy of the distance measurement is improved.

Furthermore, the threshold current Ith of the LD 121 changes with temperature and aged deterioration. Meanwhile, in the ranging module 100, APC is performed before the distance measurement; therefore, the bias current and the target current are appropriately set in accordance with a change in the threshold current Ith. As a result, the LD 121 is appropriately driven, and the delay in light emission of the LD 121 is suppressed, and therefore the accuracy of the distance measurement is improved.

Moreover, the ranging module 100 is able to detect abnormality of the diffuser 123 without using a physical detection mechanism. Consequently, it is possible to easily enhance the safety of the ranging module 100.

<First Embodiment of Switching Current Generating Circuit>

Subsequently, there is described a first embodiment of a switching current generating circuit that generates and outputs a switching current in the output controller 164 of the LDD 113.

Figure 20:
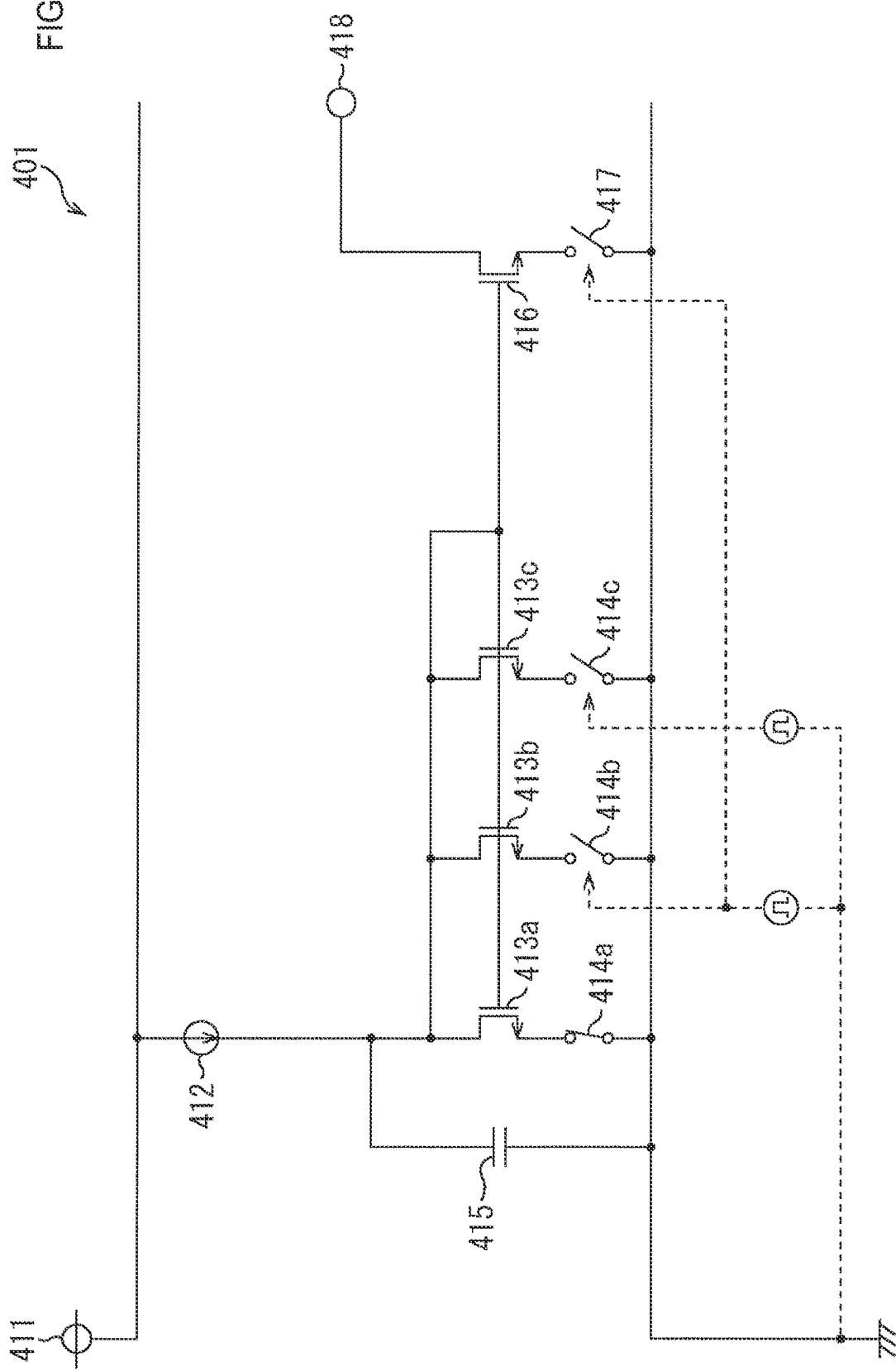
FIG. 20 is a circuit diagram illustrating a first embodiment of a switching current generating circuit.

FIG. 20 is a circuit diagram illustrating a configuration example of a switching current generating circuit 401 that is the first embodiment of the switching current generating circuit.

The switching current generating circuit 401 includes a current mirror circuit. Specifically, the switching current generating circuit 401 includes a power source 411, a current source 412, transistors 413a to 413c each including an N-type MOSFET, switches 414a to 414c, a capacitor 415, a transistor 416 including an N-type MOSFET, a switch 417, and an output terminal 418.

The current source 412 includes, for example, the IDAC 162 illustrated in FIG. 2, and is coupled to between the power source 411 and drains of the transistors 413a to 413c.

Gates of the transistors 413a to 413c and a gate of the transistor 416 are coupled to each other, and are coupled to the drains of the transistors 413a to 413c.

A source of the transistor 413a is grounded through the switch 414a. The switch 414a is a dummy switch that is always ON.

A source of the transistor 413b is grounded through the switch 414b. The switch 414b is turned ON or OFF by an ON signal or an OFF signal supplied from the APC executing section 211 or the ranging controller 212 illustrated in FIG. 3. Then, when the switch 414b is turned ON, the transistor 413b is turned ON; when the switch 414b is turned OFF, the transistor 413b is turned OFF.

A source of the transistor 413c is grounded through the switch 414c. The switch 414c is turned ON or OFF by an ON signal or an OFF signal supplied from the APC executing section 211 or the ranging controller 212. Then, when the switch 414c is turned ON, the transistor 413c is turned ON; when the switch 414c is turned OFF, the transistor 413c is turned OFF.

A drain of the transistor 416 is coupled to the output terminal 418, and a source of the transistor 416 is grounded through the switch 417. The switch 417 is turned ON or OFF by an ON signal or an OFF signal supplied from the APC executing section 211 or the ranging controller 212. Then, when the switch 417 is turned ON, the transistor 416 is turned ON; when the switch 417 is turned OFF, the transistor 416 is turned OFF.

One end of the capacitor 415 is coupled to the drains of the transistors 413a to 413c, and the other end of the capacitor 415 is grounded. The capacitor 415 is provided for suppressing variations in gate voltages of the transistors 413a to 413c and the transistor 416 (hereinafter, also referred to as a gate voltage of the current mirror circuit).

In the switching current generating circuit 401, the transistors 413a to 413c form an input stage of the current mirror circuit, and the transistor 416 forms an output stage of the current mirror circuit.

Furthermore, the size ratio (specifically, (gate width)/(gate length)) of the transistor 413a, the transistor 413b, the transistor 413c, and the transistor 416 is set to Na:Nb:Nc:(Na+Nb+Nc)×M. Then, depending on whether the input-stage transistors 413a to 413c are in ON or OFF state, the current mirror ratio (also referred to as the ratio of output current and input current or the return ratio) of the current mirror circuit changes.

Specifically, in a state where only the input-stage transistor 413a is ON, and the input-stage transistors 413b and 413c and the output-stage transistor 416 are OFF (hereinafter, referred to as an initial state), the current mirror ratio is (Na+Nb+Nc)×M/Na. In the initial state, the transistor 416 is OFF, and thus no current is outputted.

In a state where the input-stage transistors 413a and 413b and the output-stage transistor 416 are ON, and the input-stage transistor 413c is OFF (hereinafter, referred to as an intermediate state), the current mirror ratio is (Na+Nb+Nc)×M/(Na+Nb). Therefore, in the intermediate state, an output current (a switching current) that is (Na+Nb+Nc)×M/(Na+Nb) times the input current supplied from the current source 402 is outputted from the output terminal 408.

In a state where the input-stage transistors 413a, 413b, and 413c and the output-stage transistor 416 are all ON (hereinafter, referred to as a steady state), the current mirror ratio is (Na+Nb+Nc)×M/(Na+Nb+Nc)=M. Therefore, in the steady state, an output current (a switching current) that is M times the input current supplied from the current source 402 is outputted from the output terminal 408.

Therefore, the current mirror ratio satisfies the equation, the initial state>the intermediate state>the steady state.

Then, as will be described later, the switching current generating circuit 401 controls the timing to turn the transistors 413b and 413c and the transistor 416 ON or OFF, and thereby improving the slew rate of the driving current of the LD 121.

Here, causes of a reduction in the slew rate of the driving current of the LD 121 are described with reference to FIGS. 21 to 23.

Figure 21:
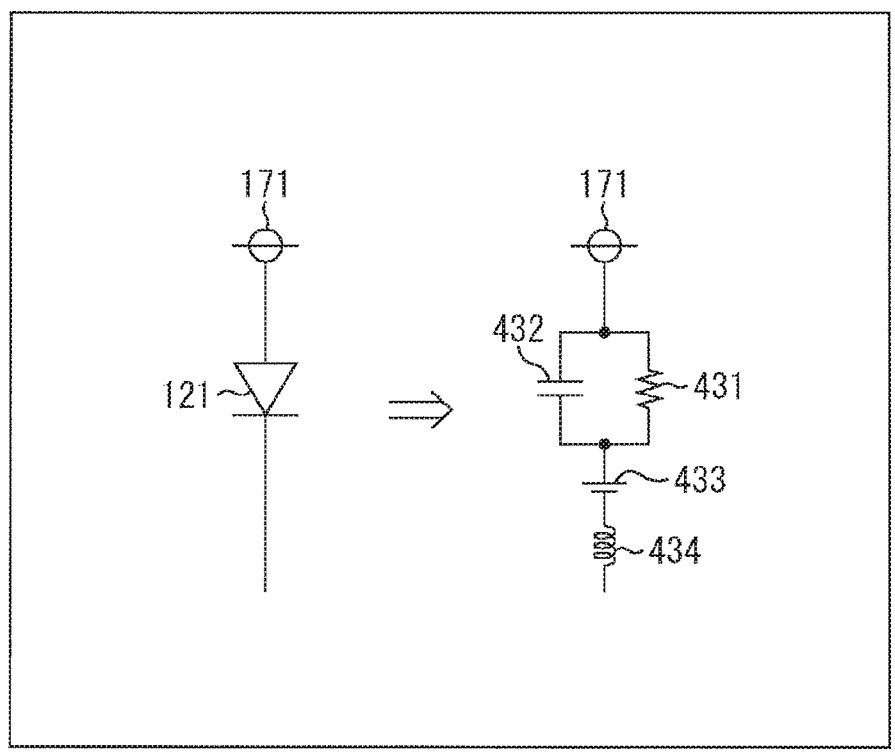
FIG. 21 is a circuit diagram illustrating an equivalent circuit of an LD.

A right part of FIG. 21 illustrates an equivalent circuit of the LD 121 on the left.

The equivalent circuit of the LD 121 is represented by an active resistance 431, a parasitic capacitance 432, a power source 433 that supplies a minimum voltage of an operating voltage Vop of the LD 121, and a parasitic inductance 434. Additionally, the active resistance 431 and the parasitic capacitance 432 are coupled in parallel to between the power source 171 and a + terminal of the power source 433, and the parasitic inductance 434 is coupled to a − terminal of the power source 433.

For example, in a printer, an optical disk, etc., the intensity of required laser light is low; therefore, the LD 121 is used in a low driving current range. Then, in the low driving current range, the slew rate at the time of rise of the driving current is determined mainly by respective time constants of the active resistance 431 and the parasitic capacitance 432.

Meanwhile, as described above, in the ranging module 100, the LD 121 is used in a very high driving current range. Then, as the driving current becomes higher, the parasitic inductance 434 has greater influence on the slew rate at the time of rise of the driving current than the active resistance 431 and the parasitic capacitance 432.

Figure 22:
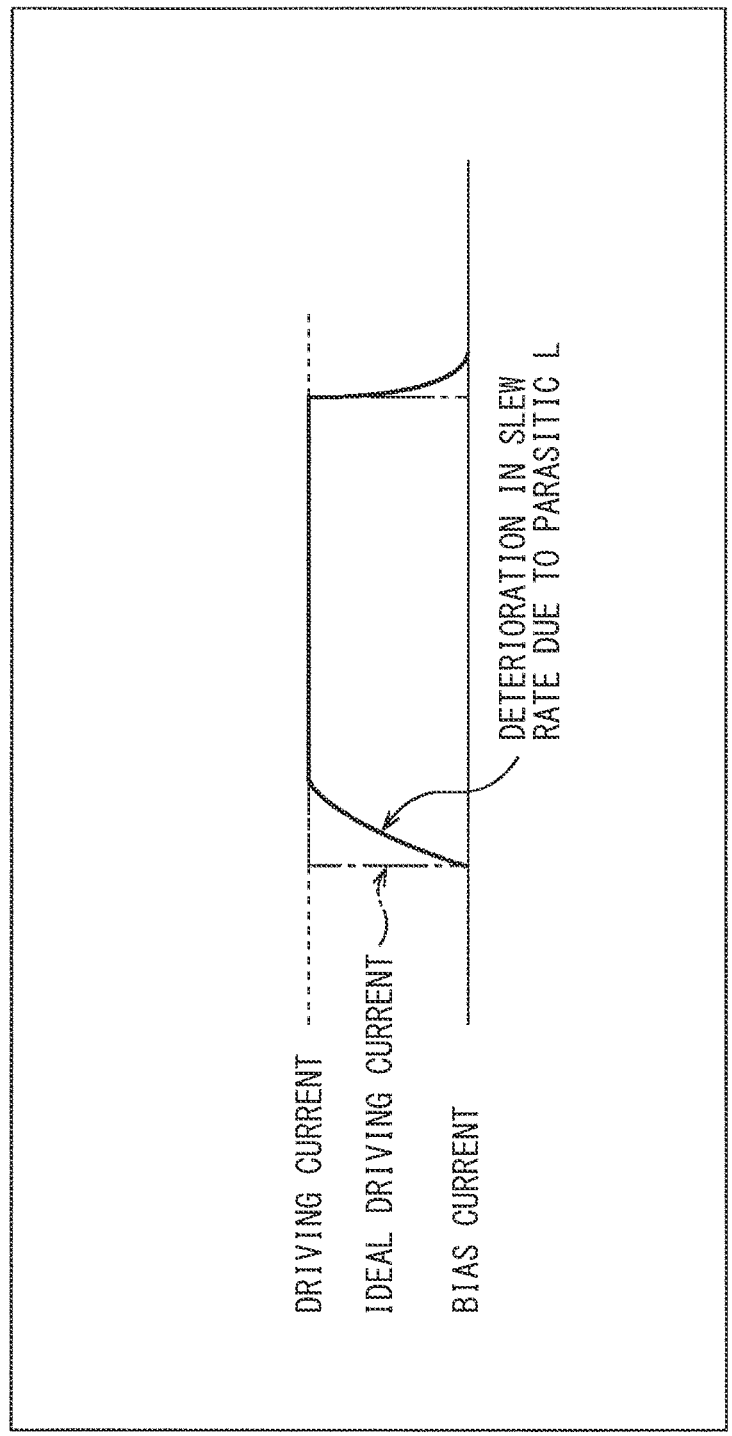
FIG. 22 is a graph for explaining a reduction in a slew rate of a driving current of the LD.
Figure 23:
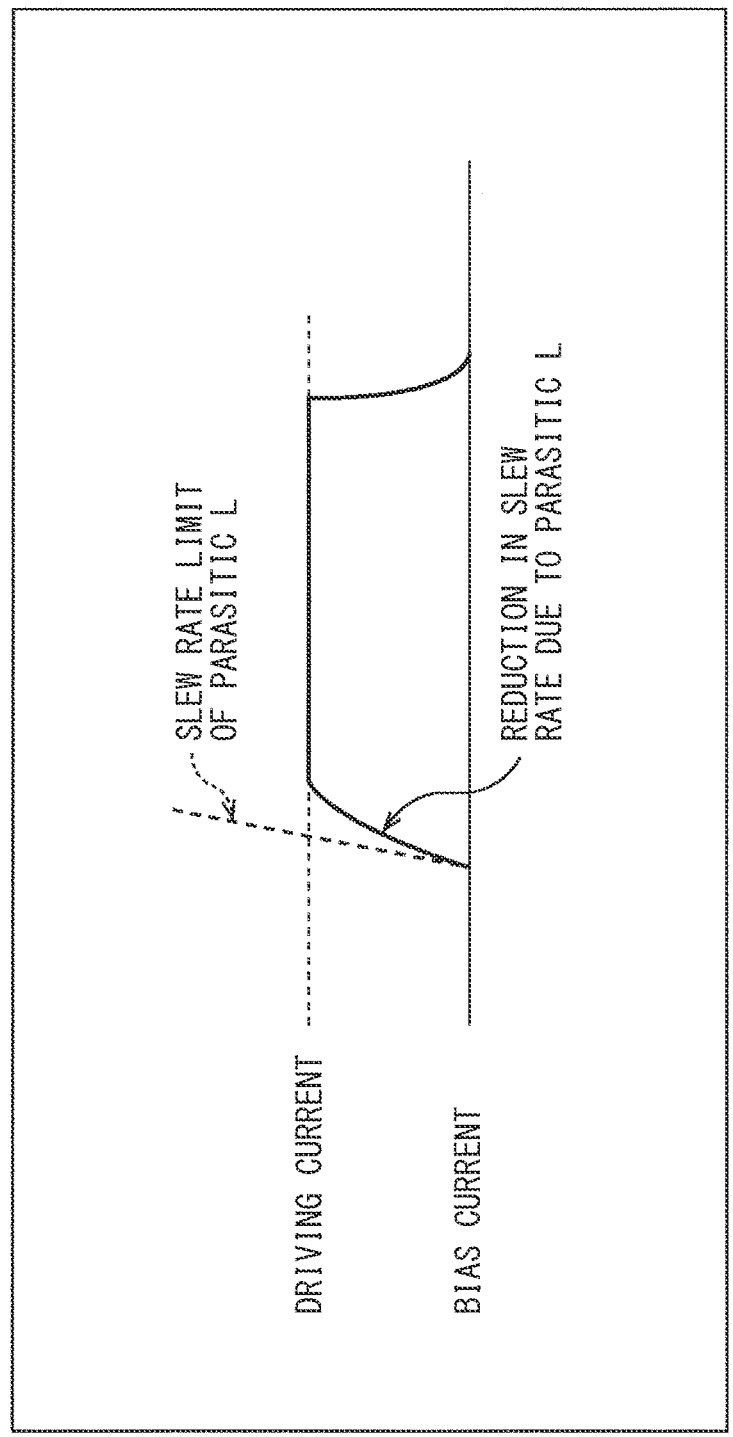
FIG. 23 is a graph for explaining a limit on the slew rate of the driving current of the LD.

For example, FIG. 22 illustrates an example of respective waveforms of an ideal driving current and an actual driving current of the LD 121. In FIG. 22, the horizontal axis indicates a time, and the vertical axis indicates a current value. Furthermore, the waveform depicted by an alternate long and short dash line indicates the ideal driving current, and the waveform depicted by a solid line indicates the actual driving current.

As illustrated in this graph, due to the influence of the parasitic inductance 434 (a parasitic L), the actual driving current is more reduced in the slew rate at the time of its rise than the ideal driving current is.

To cope with this, it may be possible to improve the slew rate by supplying a supplementary assist current by some sort of means at the time of rise of the driving current. In this case, however, as indicated by a dotted line in FIG. 23, the parasitic inductance 434 puts a limit on the slew rate of the driving current, it is difficult to increase the response speed of the driving current beyond the limit.

Furthermore, in the ranging module 100, the driving current becomes higher, and therefore a high assist current is required. Thus, if a differential current of a typical capacitance is used as an assist current, it is difficult to improve the slew rate because the amount of current is not enough.

Therefore, an adder circuit for supplying an assist current is required separately, which increases the size of the transistor 416. If the size of the transistor 416 is increased, a parasitic capacitance between the drain and the gate and between the gate and the source of the transistor 416 becomes larger.

Due to this parasitic capacitance, the gate voltage of the transistor 416 decreases for an instant when the transistor 416 is turned ON, and after that, gradually increases. And then, the gate voltage of the transistor 416 decreases, and thereby a drain current of the transistor 416 (an output current of the current mirror circuit) is reduced. This causes distortion like a sag in the output current of the current mirror circuit.

To reduce the decrease in the gate voltage of the transistor 416 caused by the parasitic capacitance, it may be possible to provide the gate of the transistor 416 with a high capacitance. However, there is no path to supplement an electrical charge extracted from the gate capacitance due to the parasitic capacitance of the transistor 416, and thus, although it is possible to reduce distortion of the output current to a certain degree, its effect is limited. Furthermore, a required capacitance becomes very large, and therefore it is difficult to install the capacitance inside a semiconductor included in the transistor 416.

<Operation of Switching Current Generating Circuit>

Subsequently, the operation of the switching current generating circuit 401 is described with reference to timing charts of FIGS. 24 to 26.

Figure 24:
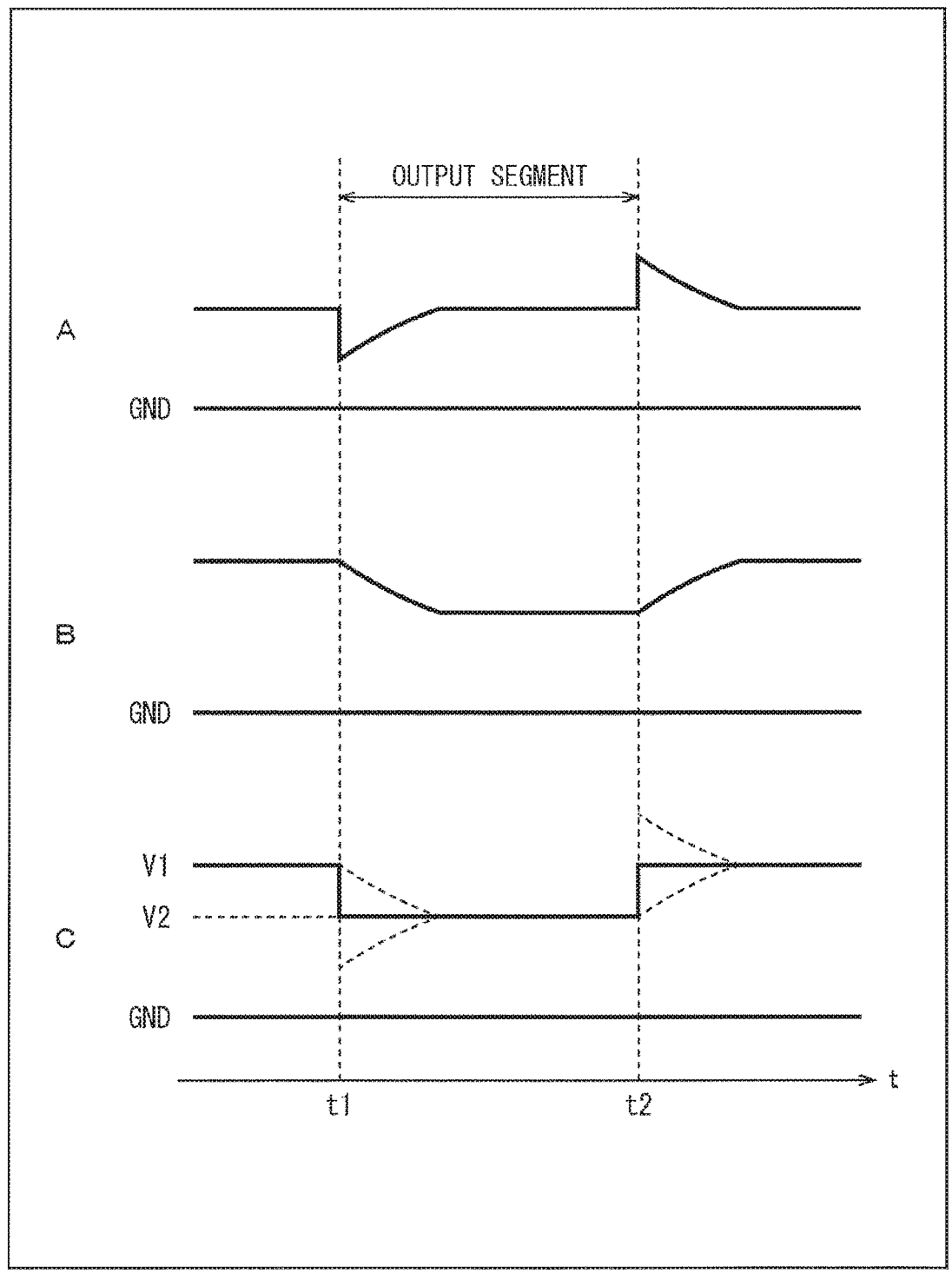
FIG. 24 is a timing chart illustrating a first example of the operation of the switching current generating circuit.
Figure 25:
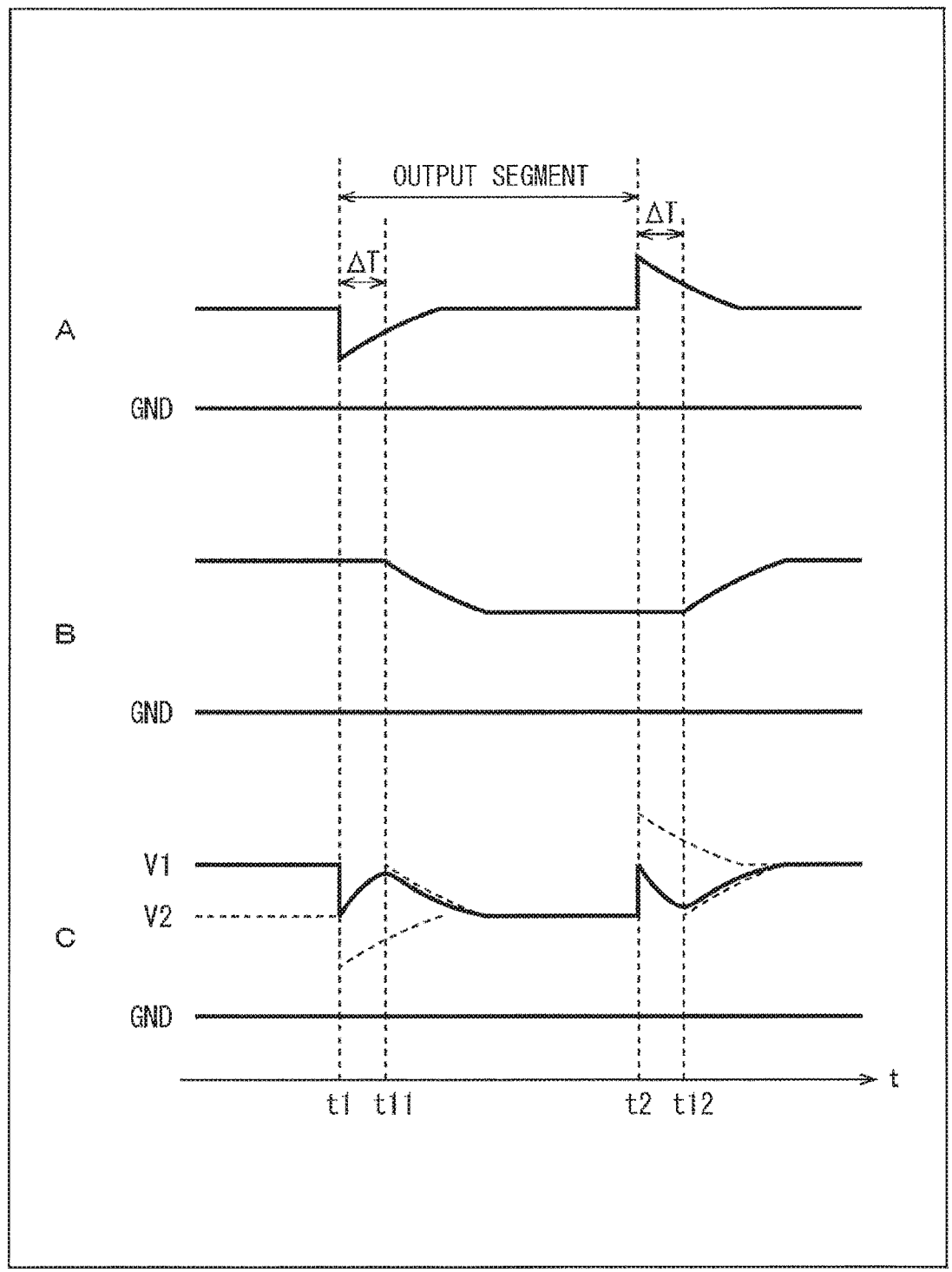
FIG. 25 is a timing chart illustrating a second example of the operation of the switching current generating circuit.
Figure 26:
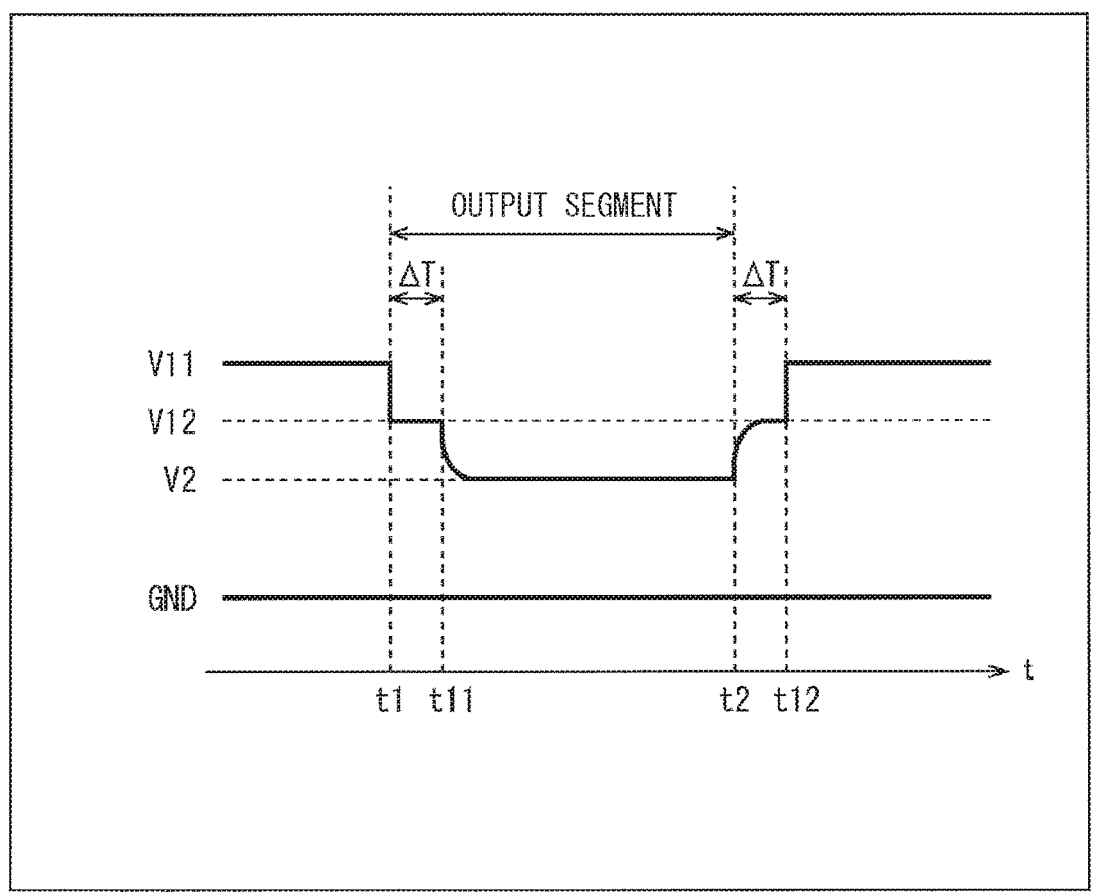
FIG. 26 is a timing chart illustrating a third example of the operation of the switching current generating circuit.

It is to be noted that in FIGS. 24 to 26, the horizontal axis indicates a time, and the vertical axis indicates respective gate voltages of the transistors 413a to 413c and the transistor 416 (a gate voltage of the current mirror circuit).

First, with reference to FIG. 24, there is described a case where an output current (a switching current) of the switching current generating circuit 401 is turned ON or OFF by turning the switches 414b and 414c and the switch 417 ON or OFF at the same time.

Part A of FIG. 24 illustrates changes in the gate voltage caused by turning the output-stage switch 417 ON or OFF, thereby turning the transistor 416 ON or OFF. Part B of FIG. 24 illustrates changes in the gate voltage caused by turning the input-stage switches 414b and 414c ON or OFF, thereby turning the transistors 413b and 413c ON or OFF. Part C of FIG. 24 illustrates an actual gate voltage in which parts A and B of FIG. 24 are added up.

Before a time t1, the switch 414a is turned ON, and the switches 414b and 414c and the switch 417 are turned OFF, and thereby the transistor 413a is turned ON, and the transistors 413b and 413c and the transistor 416 are turned OFF. That is, the current mirror circuit is set in the initial state, and the current mirror ratio is set to (Na+Nb+Nc)×M/Na. However, the transistor 416 is OFF, and thus no current is outputted from the switching current generating circuit 401.

Furthermore, only the input-stage transistor 413a is ON, and therefore, the gate voltage becomes higher than that is in the steady state where the transistors 413a to 413c are all ON.

At the time t1, the switches 414b and 414c and the switch 417 are turned ON, and thereby the transistors 413b and 413c and the transistor 416 are turned ON. Thus, the current mirror circuit makes transition from the initial state to the steady state, and the current mirror ratio decreases from (Na+Nb+Nc)×M/Na to M (the current mirror ratio is reduced). Furthermore, the output of an output current that is M times the input current from the switching current generating circuit 401 is started.

At this time, the output-stage transistor 416 is turned ON, which causes a variation in the gate voltage due to the parasitic capacitance between the drain and the gate and between the gate and the source of the transistor 416. That is, as illustrated in part A of FIG. 24, the gate voltage decreases for an instant at the time t1, and after that, is gradually back to the original voltage, and becomes stable.

Furthermore, the input-stage transistors 413b and 413c are turned ON, and thereby, the gate voltage gradually decreases, and becomes stable at a predetermined voltage, as illustrated in part B of FIG. 24.

At a time t2, the switches 414b and 414c and the switch 417 are turned OFF, and thereby the transistors 413b and 413c and the transistor 416 are turned OFF. Thus, the current mirror circuit makes transition from the steady state to the initial state, and the current mirror ratio increases from M to (Na+Nb+Nc)×M/Na (the current mirror ratio is raised). Furthermore, the output of a current from the switching current generating circuit 401 is stopped. Therefore, a segment from the time t1 to the time t2 is an output segment of the output current.

At this time, the transistor 416 is turned OFF, which causes a variation in the gate voltage due to the parasitic capacitance of the transistor 416. That is, as illustrated in part A of FIG. 24, the gate voltage increases for an instant at the time t2, and after that, is gradually back to the original voltage, and becomes stable.

Furthermore, the input-stage transistors 413b and 413c are turned OFF, and thereby the gate voltage gradually increases and becomes stable at the voltage in the initial state, as illustrated in part B of FIG. 24.

Here, by appropriately setting the size of the transistor 413a, it becomes possible to offset the variation in the gate voltage caused by switching of the output stage illustrated in part A of FIG. 24 and the decrease and increase in the gate voltage caused by switching of the input stage illustrated in part B of FIG. 24. That is, without having to add a large capacitance, a difference in the gate voltage between before and after the switching of the input-stage transistors 413b and 413c causes an electrical charge to be supplied to the parasitic capacitance of the output-stage transistor 416, and the parasitic capacitance is charged. Thus, the variation in the gate voltage at the time of switching of the transistor 416 is offset.

As a result, as illustrated in part C of FIG. 24, the gate voltage exhibits a nearly flat characteristic. That is, in the initial state before the time t1, the transistors 413b and 413c are OFF, and thus the gate voltage becomes a voltage V1 that is higher than a voltage V2 in the steady state. At the time t1, the transistors 413b and 413c and the transistor 416 are turned ON, and the gate voltage instantaneously decreases to the voltage V2 and becomes stable with the transition from the initial state to the steady state. Furthermore, at the time t2, the transistors 413b and 413c and the transistor 416 are turned OFF, and the gate voltage instantaneously increases to the voltage V2 and becomes stable with the transition from the steady state to the initial state.

In this way, the gate voltage changes in nearly flat pulses, and thus the output current of the switching current generating circuit 401 also changes in nearly flat pulses, and a waveform of the output current becomes stable.

Next, with reference to FIG. 25, there is described a case where when a current is outputted from the switching current generating circuit 401, the input-stage transistors 413a to 413c are turned ON or OFF with a delay of a delay time $\Delta T$ [nsec] after the output-stage transistor 416 is turned ON or OFF. It is to be noted that the delay time $\Delta T$ is variable, and is set to be, for example, within 3 nsec.

Part A of FIG. 25 illustrates, as with part A of FIG. 24, changes in the gate voltage caused by turning the output-stage switch 417 ON or OFF, thereby turning the transistor 416 ON or OFF. Part B of FIG. 25 illustrates, as with part B of FIG. 24, changes in the gate voltage caused by turning the input-stage switches 414b and 414c ON or OFF, thereby turning the transistors 413b and 413c ON or OFF. Part C of FIG. 25 illustrates an actual gate voltage in which parts A and B of FIG. 25 are added up.

The timing to turn the output-stage switch 417 and the transistor 416 ON or OFF is the same as that in an example of FIG. 24, and thus the waveform of the gate voltage in part A of FIG. 25 is similar to the waveform of the gate voltage in part A of FIG. 24.

Meanwhile, as described above, the timing to turn the input-stage switches 414b and 414c and the transistors 413b and 413c ON or OFF is delayed by the delay time $\Delta T$ from the timing to turn the output-stage switch 417 and the transistor 416 ON or OFF. Therefore, the waveform of the gate voltage in part B of FIG. 25 is delayed by the delay time ΔT from the waveform of the gate voltage in part B of FIG. 24.

Therefore, as illustrated in part C of FIG. 25, the gate voltage becomes the voltage V1 higher than the voltage V2 before the time t1, as with an example of part C of FIG. 24.

At the time t1, the transistor 416 is turned ON, and accordingly, the gate voltage decreases for an instant and then increases. Thus, after the passage of the delay time ΔT from the time t1 to a time t11 at which the transistors 413b and 413c are turned ON, there is a raised part where the gate voltage becomes higher than the voltage V2 in the steady state.

During that time, only the transistor 413a is ON, and the transistors 413b and 413c are OFF, and thus the current mirror ratio becomes (Na+Nb+Nc)×M/Na, and an output current that is (Na+Nb+Nc)×M/Na times the input current is outputted. This output current is higher than the output current in the steady state (M times the input current), and therefore is able to be used as an assist current at the time of rise of the driving current of the LD 121.

Here, the magnitude of the assist current is adjusted by adjusting the size ratio Na:Nb:Nc of the input-stage transistors 413a to 413c. Furthermore, time to supply the assist current is adjusted by adjusting the delay time ΔT. Therefore, it becomes possible to suppress the influence of the parasitic inductance 434 and improve the slew rate of the driving current of the LD 121 by appropriately setting the size ratio Na:Nb:Nc and the delay time ΔT.

At the time t11, the transistors 413b and 413c are turned ON, and accordingly the gate voltage gradually decreases and becomes stable at the voltage V2. Furthermore, the current mirror ratio decreases from (Na+Nb+Nc)×M/Na to M (the current mirror ratio is reduced). Thus, the output current of the switching current generating circuit 401 becomes a predetermined current (a target current), and becomes stable.

At the time t2, the transistor 416 is turned OFF, and accordingly the gate voltage increases for an instant and then decreases. Furthermore, the output of a current from the switching current generating circuit 401 is stopped.

At a time t12 after the passage of the delay time ΔT from the time t2, the transistors 413b and 413c are turned OFF, and accordingly the gate voltage gradually increases and becomes stable at the voltage V1. Furthermore, the current mirror ratio increases from M to (Na+Nb+Nc)×M/Na (the current mirror ratio is raised).

A variation in the gate voltage after the time t2 basically does not affect the output current because the transistor 416 is OFF. However, for example, if an interval until the transistor 416 is turned ON next is short, and this variation in the gate voltage affects the output current, it becomes possible to mask the variation in the gate voltage by adding, for example, a simple logic circuit.

Next, with reference to FIG. 26, there is described a case where when a current is outputted from the switching current generating circuit 401, the input-stage transistor 413b and the output-stage transistor 416 are turned ON or OFF, and thereafter the input-stage transistor 413c is turned ON or OFF with a delay of the delay time ΔT.

FIG. 26 illustrates a waveform of the gate voltage, as with part C of FIG. 24 and part C of FIG. 25.

Before the time t1, only the transistor 413a is ON, as in the examples of FIGS. 24 and 25.

At the time t1, the switch 414b and the switch 417 are turned ON, and thereby the input-stage transistor 413b and the output-stage transistor 416 are turned ON. Thus, the current mirror circuit makes transition from the initial state to the intermediate state, and the current mirror ratio decreases from (Na+Nb+Nc)×M/Na to (Na+Nb+Nc)×M/(Na+Nb) (the current mirror ratio is reduced). Furthermore, the output of an output current that is (Na+Nb+Nc)×M/(Na+Nb) times (>M times) the input current from the switching current generating circuit 401 is started.

Here, as illustrated in FIG. 26, it becomes possible to set the gate voltage in the initial state before the time t1 to an appropriate voltage V11 higher than the voltage V1 illustrated in part C of FIG. 24 and part C of FIG. 25 by appropriately setting the size ratio Na:Nb:Nc of the input-stage transistors 413a to 413c. Thus, as with the case of the time t1 in part C of FIG. 24, it is possible to suppress the variation in the gate voltage due to the parasitic capacitance of the transistor 416 when the transistor 416 is turned ON and to instantaneously decrease the gate voltage flat to a voltage V12 to stabilize the gate voltage at the voltage V12.

Furthermore, the output current becomes higher than the output current in the steady state (M times the input current) from the time t1 to the time t11, and therefore is able to be used as an assist current at the time of rise of the driving current of the LD 121.

Here, the magnitude of the assist current is adjusted by adjusting the size ratio Na:Nb:Nc of the input-stage transistors 413a to 413c. Furthermore, time to supply the assist current is adjusted by adjusting the delay time ΔT. Therefore, it becomes possible to suppress the influence of the parasitic inductance 434 and improve the slew rate of the driving current of the LD 121 by appropriately setting the size ratio Na:Nb:Nc and the delay time ΔT.

At the time t11, the switch 414c is turned ON, and thereby the input-stage transistor 413c is turned ON. Thus, the current mirror circuit makes transition from the intermediate state to the steady state, and the current mirror ratio changes from (Na+Nb+Nc)×M/(Na+Nb) to M (the current mirror ratio is reduced). Furthermore, the gate voltage decreases from the voltage V12 to the voltage V2, and becomes stable. Moreover, an output current of the switching current generating circuit 401 becomes the predetermined current (the target current), and becomes stable.

At the time t2, the switch 414b and the switch 417 are turned OFF, and thereby the input-stage transistor 413b and the output-stage transistor 416 are turned OFF. Thus, the current mirror ratio changes from M to (Na+Nb+Nc)×M/(Na+Nb) (the current mirror ratio is raised). Thus, the gate voltage increases from the voltage V2 to the voltage V12, and becomes stable. Furthermore, the output of a current from the switching current generating circuit 401 is stopped.

At the time t12, the switch 414c is turned OFF, and thereby the input-stage transistor 413c is turned OFF. Thus, the current mirror ratio increases from (Na+Nb+Nc)×M/(Na+Nb) to (Na+Nb+Nc)×M/Na (the current mirror ratio is raised). Furthermore, the gate voltage instantaneously increases flat from the voltage V12 to the voltage V11, and becomes stable.

As described above, it is possible to improve the slew rate of the driving current of the LD 121 and stabilize the waveform of the driving current flat without having to provide a dedicated circuit or a large capacitance and without increasing the circuit scale. Accordingly, it is possible to appropriately drive the LD 121. Furthermore, a dedicated circuit or a current source for an assist current is not used, and therefore it is possible to suppress an increase in power consumption.

Furthermore, it is possible to apply the switching current generating circuit 401 to various LDs, regardless of the type. Moreover, the switching current generating circuit 401 is applicable whether control of the driving current is analog or digital, <Second Embodiment of Switching Current Generating Circuit>

Figure 27:
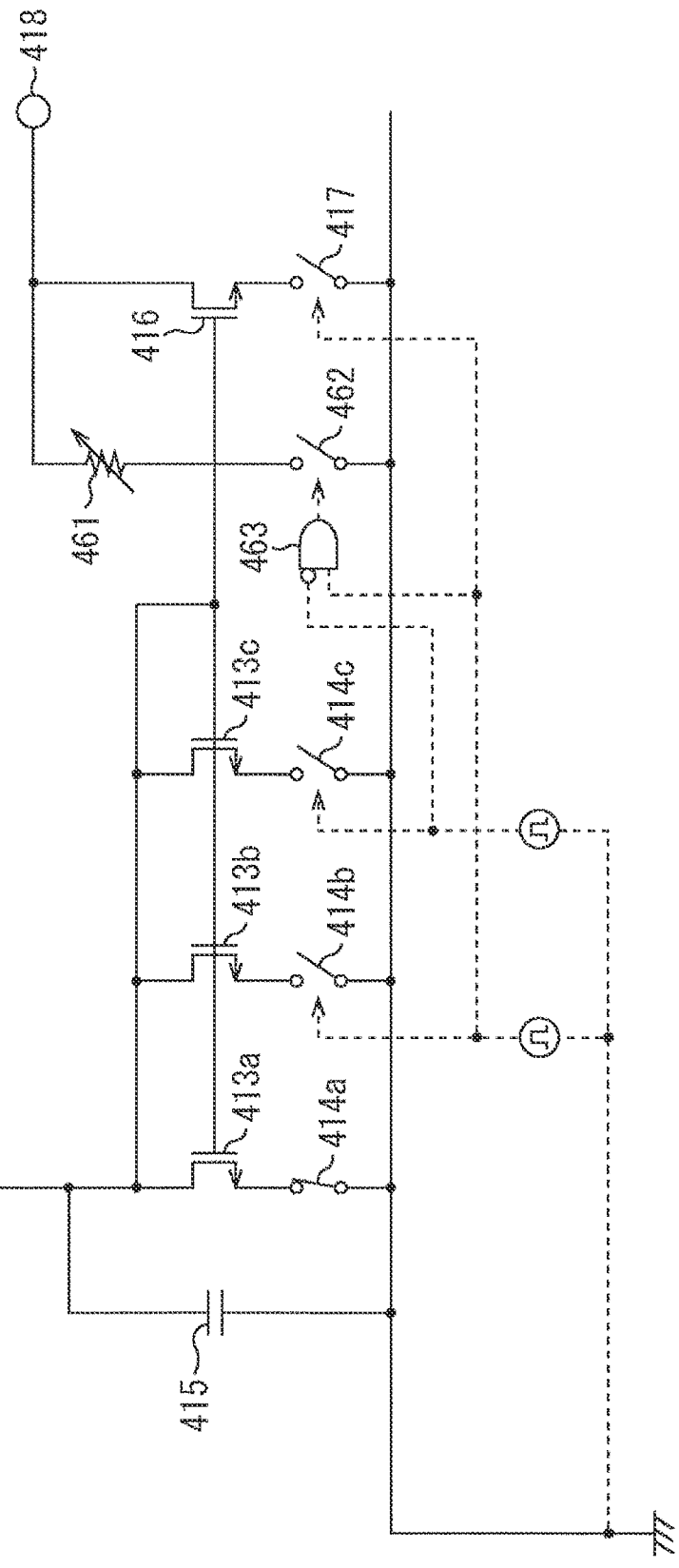
FIG. 27 is a circuit diagram illustrating a second embodiment of the switching current generating circuit.

FIG. 27 is a circuit diagram illustrating a configuration example of a switching current generating circuit 451 that is a second embodiment of the switching current generating circuit.

The above-described switching current generating circuit 401 is effective particularly in a case where the voltage of the power source 171 (FIG. 2) to which the LD 121 is coupled is sufficiently high.

Meanwhile, in a case where the voltage of the power source 171 is low, the switching current generating circuit 401 does not sometimes work well. That is, in the switching current generating circuit 401, when the driving current starts flowing into the LD 121, the drain voltage of the transistor 416 decreases due to a reverse voltage caused by the parasitic inductance 434. Then, in the case where the voltage of the power source 171 is low, there is a possibility that the drain voltage of the transistor 416 may be insufficient, and a drain current (an output current) may not be sufficiently outputted.

The switching current generating circuit 451 illustrated in FIG. 27 takes a measure against this phenomenon. The switching current generating circuit 451 differs from the switching current generating circuit 401 illustrated in FIG. 20 in that the switching current generating circuit 451 further includes a variable resistance 461, a switch 462, and an AND circuit 463.

The variable resistance 461 is very low in resistance value, and serves as a shunt circuit. Furthermore, the variable resistance 461 is coupled to the output stage of the current mirror circuit through the switch 417. More specifically, the variable resistance 461 is coupled to between the drain of the transistor 416 (the output terminal 418) and the ground through the switch 417. Then, the variable resistance 461 is coupled to and separated from the output stage of the current mirror circuit by the switch 417.

The AND circuit 463 inputs an ON signal to the switch 462 in a case where an ON signal is inputted to the switch 414b, and an OFF signal is inputted to the switch 414c, and inputs an OFF signal to the switch 462 in other cases. Therefore, the switch 462 is turned ON in a case where the switch 414b is turned ON, and thereby the transistor 413b is turned ON, and the switch 414c is turned OFF, and thereby the transistor 413c is turned OFF, and is turned OFF in other cases. Thus, in a period from the time t1 to the time t11 in FIG. 26, the switching current generating circuit 451 is in a state where the variable resistance 461 is coupled to the output stage of the current mirror circuit.

Therefore, at the moment when the driving current starts flowing into the LD 121, the LD 121 is driven with a voltage applied through the variable resistance 461. Thus, even if the voltage of the power source 171 is low, it is possible to increase the slew rate of the driving current of the LD 121 without depending on the drain voltage of the transistor 416.

After that, the current starts flowing into the parasitic inductance 434, and, the drain voltage of the transistor 416 becomes stable. Thereafter, at the time t11, an ON signal is inputted to the switch 414c, and the transistor 413c is turned ON an. At this time, an ON signal is inputted to the switch 462, and the switch 462 is turned OFF. Thus, the variable resistance 461 is separated from the output stage of the current mirror circuit by the switch 417. Even if the variable resistance 461 is separated in this way, the drain voltage of the transistor 416 is stable, and therefore it is possible to stably supply the driving current to the LD 121.

It is to be noted that a degree of improvement in the slew rate of the driving current of the LD 121 made by the shunt circuit changes depending on the magnitude of a stationary driving current (the driving current in the steady state) after the operation of the LD 121 becomes stable. That is, the higher the stationary driving current becomes, the larger the amount of improvement the shunt circuit provides; the lower the stationary driving current becomes, the smaller the amount of improvement the shunt circuit provides. Therefore, it is desirable that the resistance value of the variable resistance 461 be decreased as the stationary driving current becomes higher, and the resistance value of the variable resistance 461 be increased as the stationary driving current becomes lower.

Meanwhile, the stationary driving current of the LD 121 varies with the output current (the switching current) from the switching current generating circuit 451, and the output current varies with the input current inputted from the current source 412 to the switching current generating circuit 451. Therefore, it is desirable that the resistance value of the variable resistance 461 be decreased as the input current becomes higher, and the resistance value of the variable resistance 461 be increased as the input current becomes lower. This makes it possible to keep the effect of the shunt circuit nearly uniformly and keep the slew rate of the driving current nearly uniformly regardless of the magnitude of the stationary driving current of the LD 121.

<Third Embodiment of Switching Current Generating Circuit>

Figure 28:
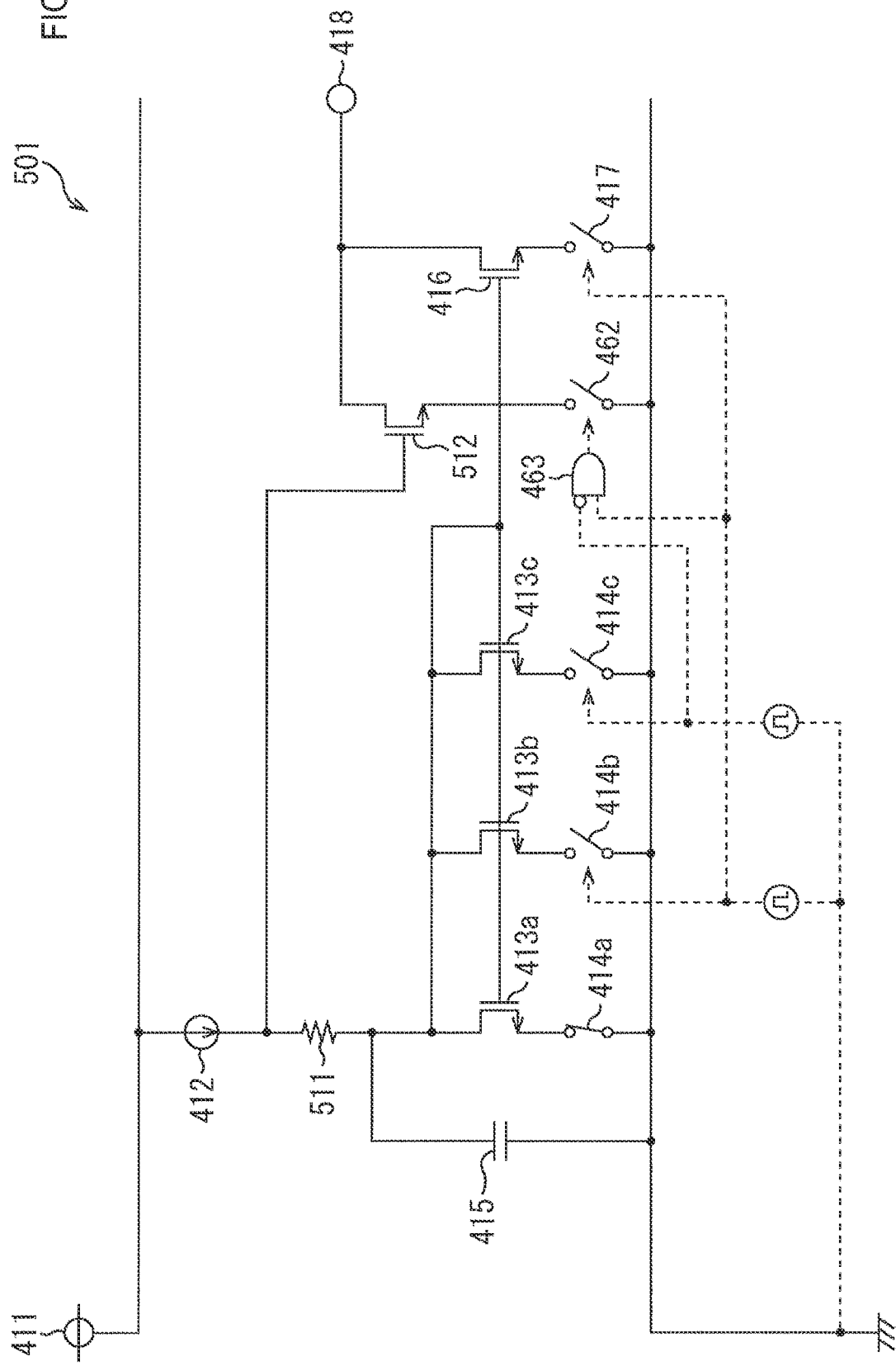
FIG. 28 is a circuit diagram illustrating a third embodiment of the switching current generating circuit.

FIG. 28 is a circuit diagram illustrating a configuration example of a switching current generating circuit 501 that is a third embodiment of the switching current generating circuit.

The switching current generating circuit 501 differs from the switching current generating circuit 451 illustrated in FIG. 27 in that the switching current generating circuit 501 does not include the variable resistance 461, and further includes a resistance 511 and a transistor 512 including an N-type MOSFET.

The resistance 511 is coupled to between the current source 412 and the drain of the transistor 413a.

The drain of the transistor 512 is coupled to the output terminal 418, and the gate is coupled to between the current source 412 and the resistance 511, and the source is grounded through the switch 462.

In this switching current generating circuit 501, a variable resistance corresponding to the variable resistance 461 of the switching current generating circuit 451 in FIG. 27 is realized by an on-resistance of the transistor 512.

Specifically, a gate voltage of the transistor 512 is defined by a current (an input current) of the current source 412 and the resistance 511. That is, the gate voltage of the transistor 512 linearly changes with voltages generated in both ends of the resistance 511 by the input current. That is, the gate voltage of the transistor 512 increases as the input current becomes higher, and decreases as the input current becomes lower.

Therefore, the higher the input current becomes, the higher the gate voltage of the transistor 512 becomes, and the lower the on-resistance becomes. On the other hand, the lower the input current becomes, the lower the gate voltage of the transistor 512 becomes, and the higher the on-resistance becomes.

In this way, it is possible to linearly change a resistance value of the shunt circuit (the on-resistance of the transistor 512) in accordance with the input current. As a result, it is possible to keep the effect of the shunt circuit nearly uniformly and keep the slew rate of the driving current nearly uniformly regardless of the magnitude of the stationary driving current of the LD 121.

<Fourth Embodiment of Switching Current Generating Circuit>

Figure 29:
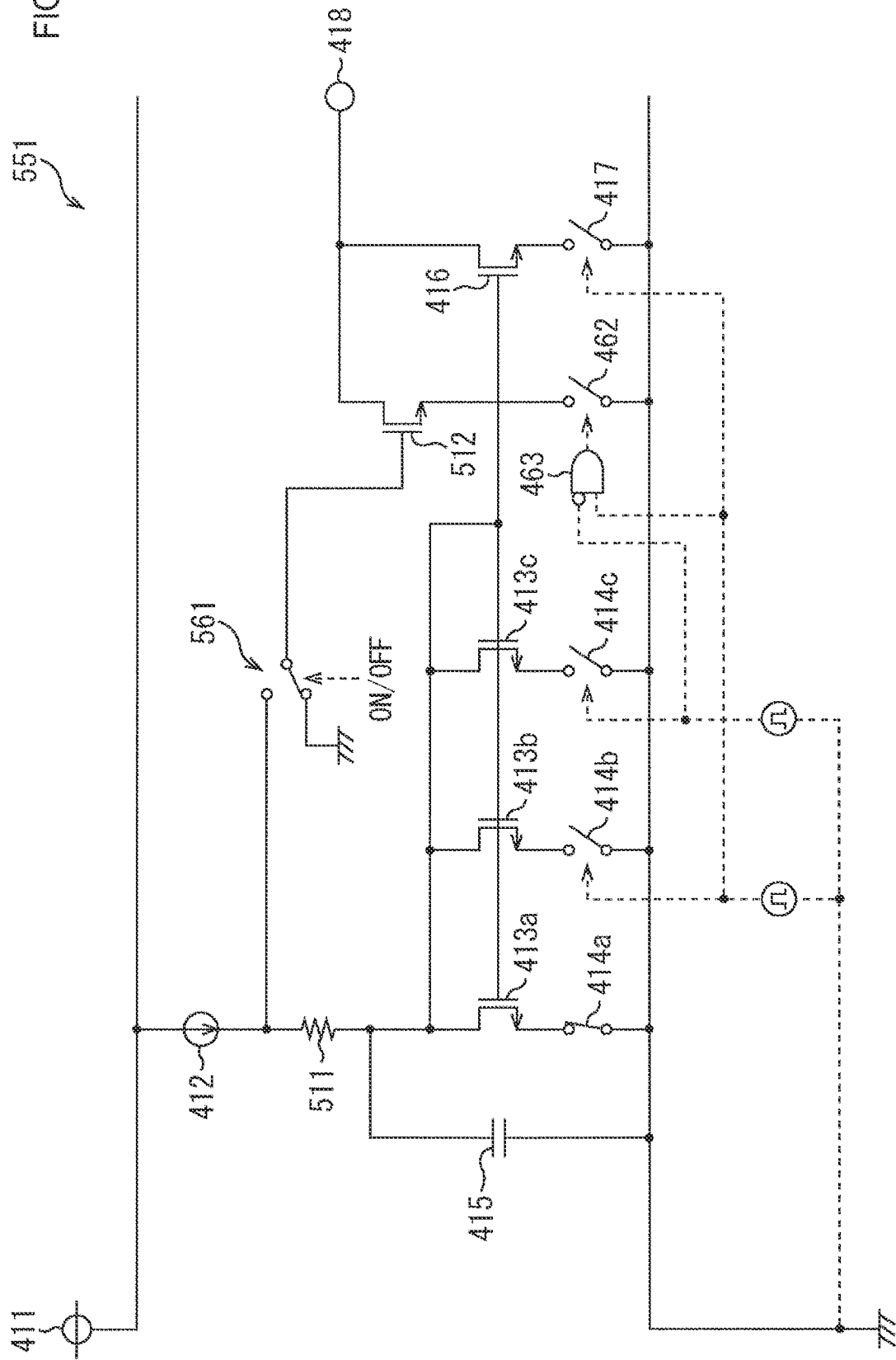
FIG. 29 is a circuit diagram illustrating a fourth embodiment of the switching current generating circuit.

FIG. 29 is a circuit diagram illustrating a configuration example of a switching current generating circuit 551 that is a fourth embodiment of the switching current generating circuit.

The switching current generating circuit 551 differs from the switching current generating circuit 501 illustrated in FIG. 28 in that the switching current generating circuit 551 further includes a switch 561.

The switch 561 is coupled to between the current source 412 and the resistance 511 and to the gate of the transistor 512. The switch 561 is turned ON when receiving an ON signal inputted from the APC executing section 211 or the ranging controller 212, and couples the gate of the transistor 512 to between the current source 412 and the resistance 511. As a result, the transistor 512 is turned ON, and the shunt circuit is enabled. Meanwhile, the switch 561 is turned OFF when receiving an OFF signal inputted from the APC executing section 211 or the ranging controller 212, and couples the gate of the transistor 512 to the ground. As a result, the transistor 512 is turned OFF, and the shunt circuit is disabled.

Thus, for example, in a case where the voltage of the power source 171 to which the LD 121 is coupled is sufficiently high, and the shunt circuit is not particularly required, the switch 561 may be turned OFF to disable the shunt circuit.

1. Modification Examples

Below are described some modification examples of the foregoing embodiments of the present technology.

Figure 4:
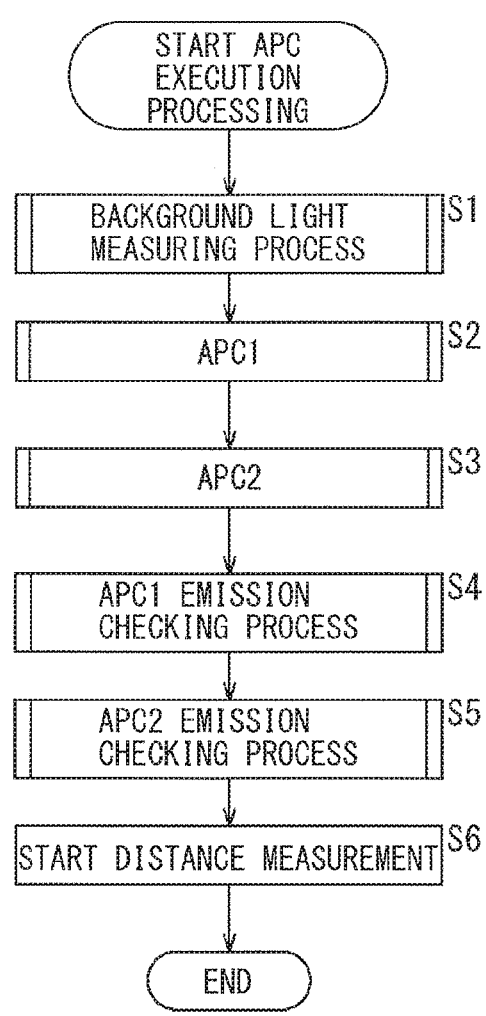
FIG. 4 is a flowchart for explaining APC execution processing performed by the ranging module.
Figure 5:
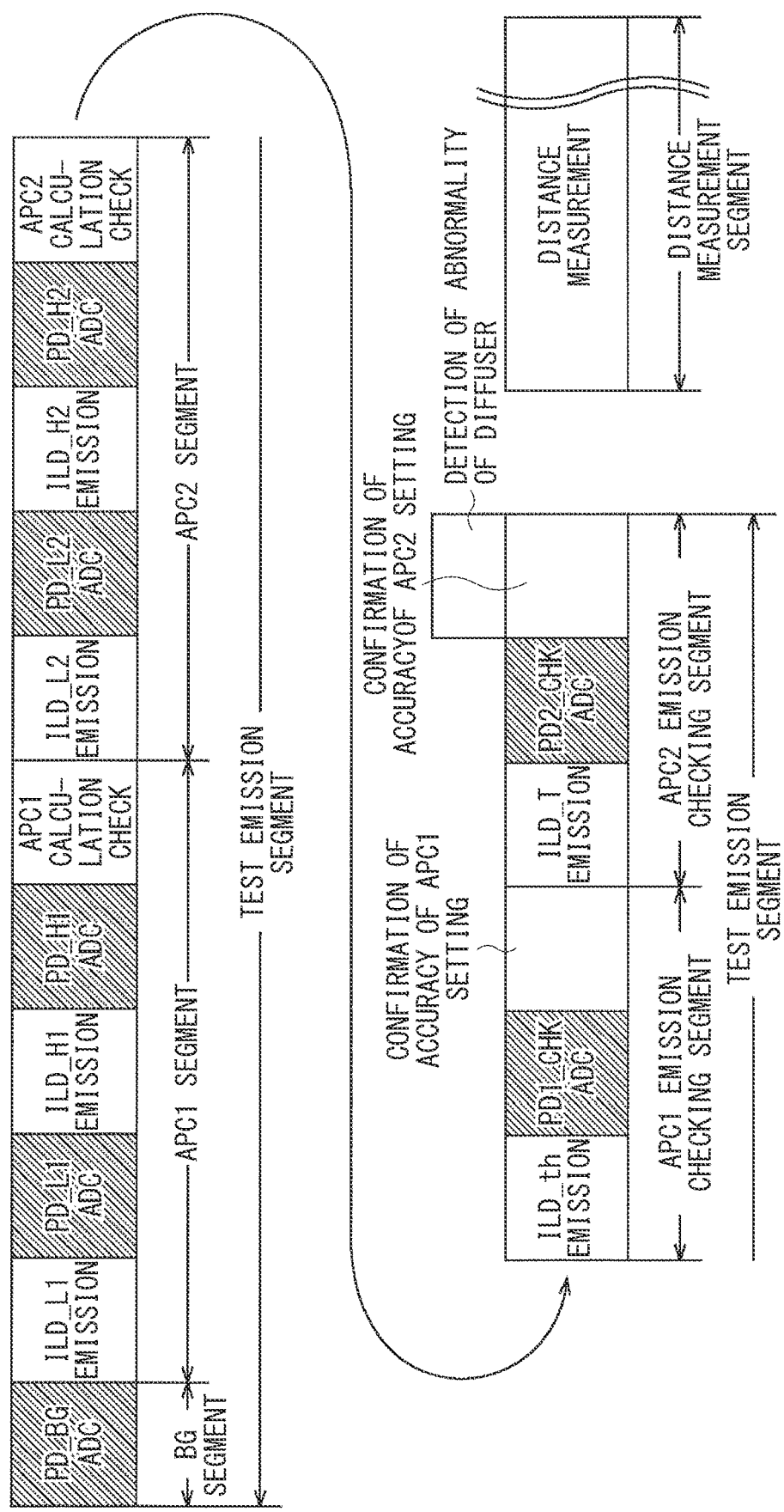
FIG. 5 is a timing chart for explaining the APC execution processing performed by the ranging module.

For example, in a case where only the accuracy of the bias current is desired to be improved, the APC2 at step S3 and the APC2 emission checking process at step S5 may be omitted in the APC execution processing illustrated in FIG. 4, and the target current may be set as a fixed value. It is to be noted that in a case where the APC2 emission checking process is omitted, the process of detecting abnormality of the diffuser 123 may be remained.

Furthermore, for example, in a case where only the accuracy of the target current is desired to be improved, the background light measuring process at Step S1, the APC1 at Step S2, and the APC1 emission checking process at step S4 may be omitted in the APC execution processing illustrated in FIG. 4, and the bias current may be set as a fixed value. It is to be noted that, for example, an offset light amount may be detected without omitting the background light measuring process, and the detected offset light amount may be used for calculation of the target current.

Figure 6:
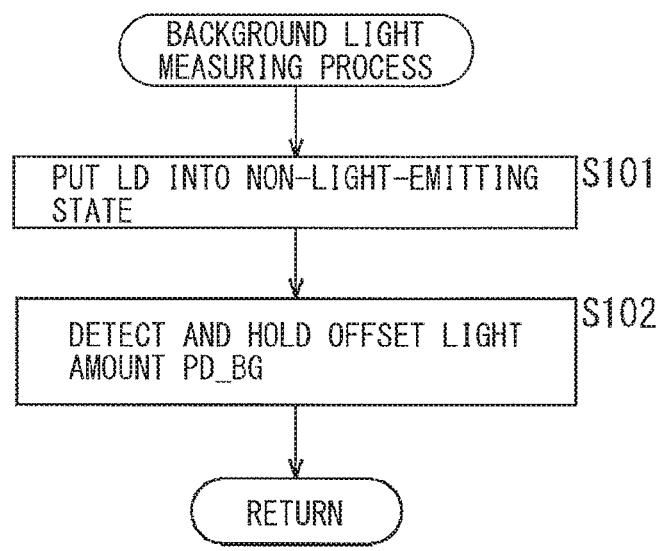
FIG. 6 is a flowchart for explaining details of a background light measuring process.
Figure 12:
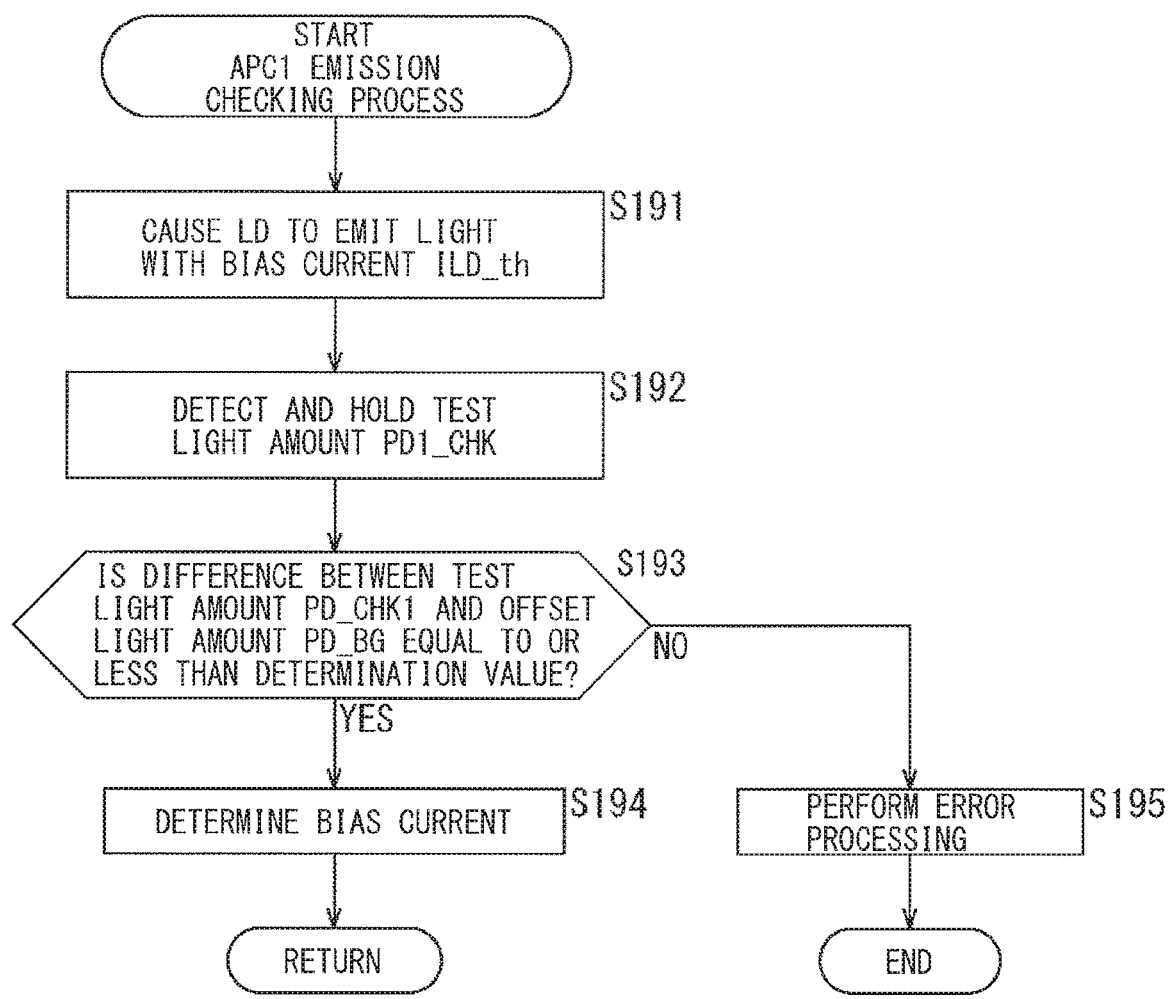
FIG. 12 is a flowchart for explaining details of an APC1 emission checking process.

Moreover, for example, in the error processing at Step S138 of FIG. 6, Step S168 of FIG. 10, and Step S195 of FIG. 12, the output of laser light from the LD 121 may not be stopped. For example, the subsequent processing may be continued using a preset bias current or target current without using the bias current or target current determined to be an error.

Figure 14:
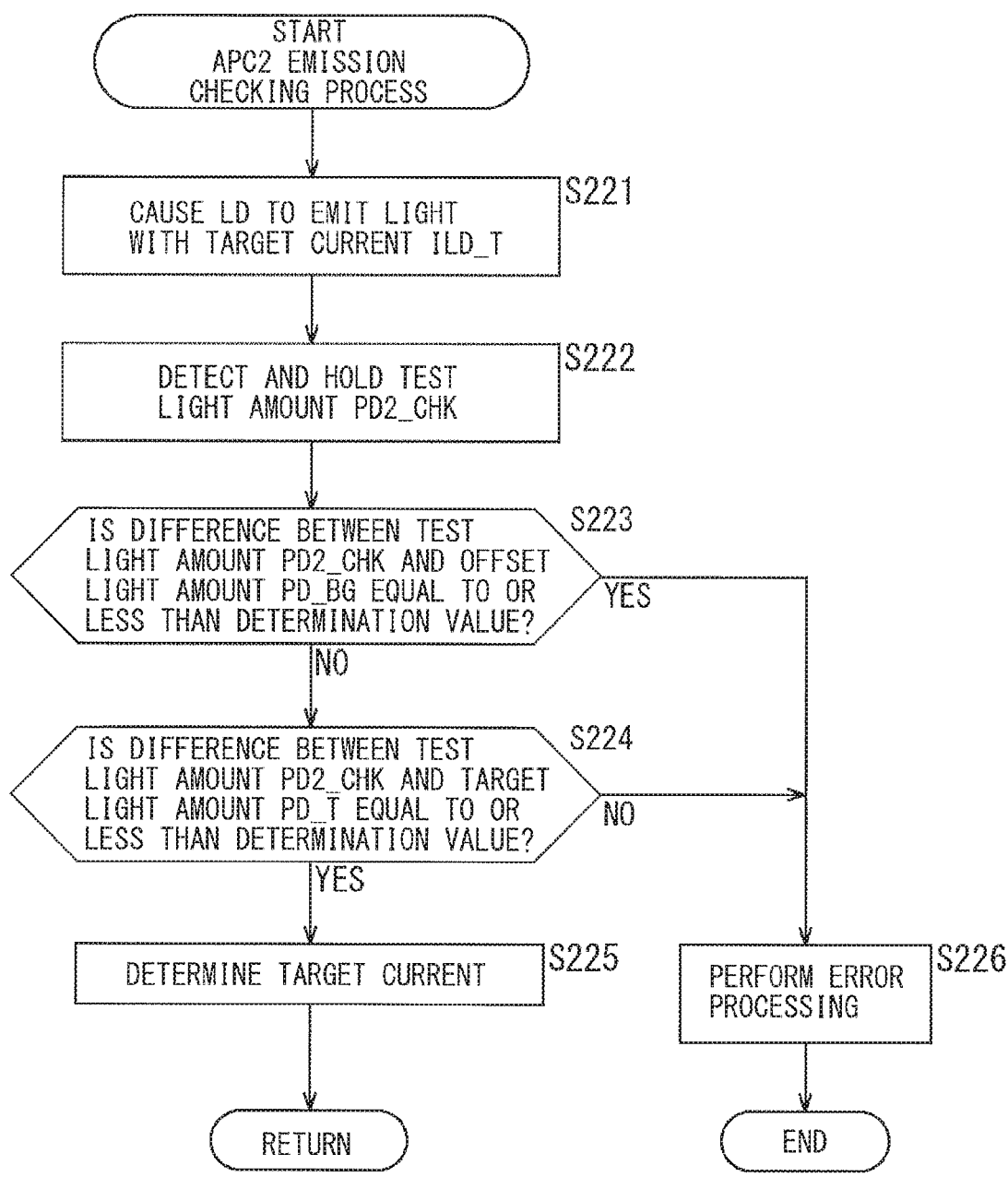
FIG. 14 is a flowchart for explaining details of an APC2 emission checking process.

Furthermore, for example, also in the processing at Step S226 in FIG. 14, the output of laser light from the LD 121 may not be stopped except in a case where abnormality of the diffuser 123 is detected. For example, the subsequent processing may be continued using a preset target current without using the target current determined to be an error.

Moreover, in the current mirror circuit illustrated in FIGS. 20 and 27 to 29, there is described an example of using an N-type MOSFET as each transistor on the assumption that the LD 121 is an anode common; however, for example, in a case where the LD 121 is a cathode common, a P-type MOSFET only has to be used as each transistor. Furthermore, for example, it is also possible for each current mirror circuit to use a transistor other than a MOSFET.

Moreover, in the above description, there is described an example where the PD 122 receives, as return light, laser light reflected by the diffuser 123; however, for example, the PD 122 may receive return light reflected by another member. Furthermore, the PD 122 may receive a portion of laser light outputted from the LD 121 by means other than return light.

Moreover, the configuration example of the ranging module 100 is not limited to the above-described example. For example, the light emitter 101, the range image sensor 115, and the LSI 116 may be provided in different modules from one another, or one of the three may be provided in a different module.

Furthermore, it is possible to apply the present technology to a case of driving a light-emitting element that outputs light other than laser light as well.

3. Others

<Applications Examples to Movable Body>

The technology according to the present disclosure (the present technology) is applicable to various products. For example, the technology according to the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, a drone, a vessel, and a robot.

Figure 30:
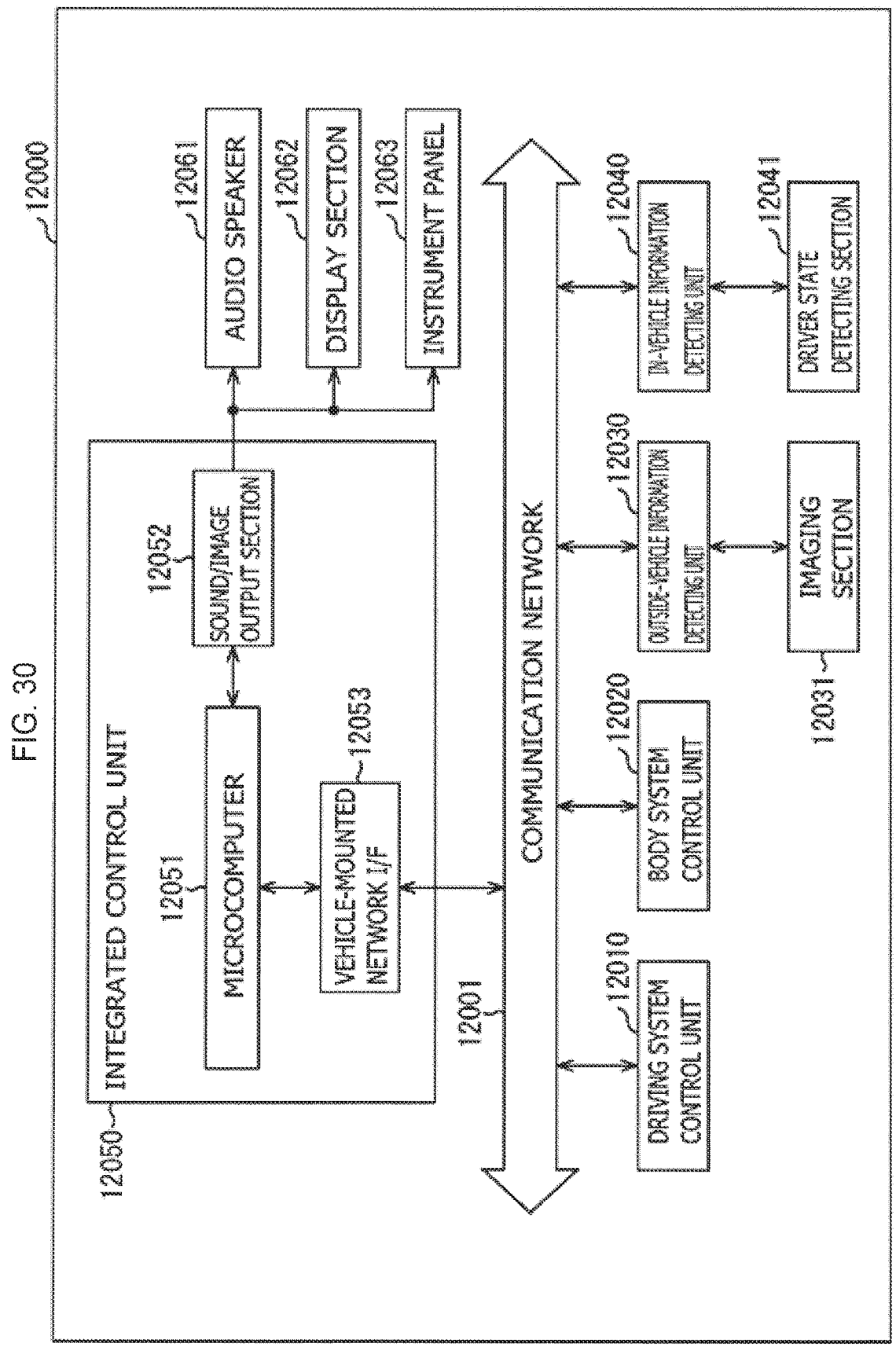
FIG. 30 is a block diagram depicting an example of schematic configuration of a vehicle control system.

FIG. 30 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 30, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 30, an audio speaker 12061, a display section 12062, and an instrument panel 12063 are illustrated as the output device. The display section 12062 may, for example, include at least one of an on-board display and a head-up display.

FIG. 31 is a diagram depicting an example of the installation position of the imaging section 12031.

In FIG. 31, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by imaging sections 12101 and 12105 is used mainly to detect a preceding vehicle, a pedestrian, an obstacle, a signal, a traffic sign, a lane, or the like.

Incidentally, FIG. 31 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure is applicable has been described in the above description. The technology according to the disclosure is applicable to, for example, the imaging sections 12101 to 12104, etc., in the configuration described above. For example, in a case where at least one of the imaging sections 12101 to 12104 has a function to acquire distance information, the ranging module 100 of FIG. 1 is applicable. This makes it possible to improve the accuracy of detection of a distance to an object around the vehicle.

The above-described series of processing may be performed by hardware, or may be performed by software. In a case where the series of processing is performed by software, a program included in the software is installed in a computer. The computer here includes a computer built in dedicated hardware (for example, such as the LSI 116 illustrated in FIG. 1) and, for example, a general-purpose personal computer or the like that is able to implement various functions by installing various programs therein.

It is to be noted that the program executed by the computer may be a program to cause the processing to be performed in chronological order in line with the order described in the present specification, or may be a program to cause the processing to be performed in parallel or at required timing such as when a call has been made.

Furthermore, in the present specification, a system means an aggregation of multiple components (devices, modules (parts), etc.), regardless of whether or not all the components are in the same chassis. Therefore, multiple devices that are housed in separate chassis and are connected through a network and one device including multiple modules housed in one chassis are both a system.

Moreover, embodiments of the present technology are not limited to the foregoing embodiments, and may be modified in a variety of ways without departing from the scope of the present technology.

For example, the present technology may have a configuration of cloud computing that allows multiple devices to share one function through a network and perform processing in cooperation.

Furthermore, the respective steps described in the above flowcharts may be performed by one device, or may be shared and performed by multiple devices.

Moreover, in a case where one step includes multiple processes, the multiple processes included in the one step may be performed by one device, or may be shared and performed by multiple devices.

<Examples of Combination of Configurations>

The present technology may have the following configurations.

(1)

A driving device including:

a setting section that sets at least one of a bias current of a light-emitting element or a target current for setting output light from the light-emitting element to desired intensity on the basis of a result of detection of an offset light amount when the light-emitting element does not emit light, the detection being performed by a light-receiving element that receives a portion of the output light; and an output controller that controls an output of a driving current of the light-emitting element on the basis of at least one of the set bias current or the set target current.

(2)

The driving device according to (1), in which the setting section sets the bias current on the basis of multiple first sample light amounts and the result of detection of the offset light amount by the light-receiving element, the multiple first sample light amounts being amounts of light in a case where the light-emitting element is caused to emit light by respective first driving currents having different values within a linear segment in which emission intensity of the light-emitting element changes substantially linearly with respect to the driving current.

(3)
The driving device according to (2), in which the setting section detects abnormality of the bias current on the basis of a result of detection of a first test light amount by the light-receiving element in a case where the light-emitting element is caused to emit light by a driving current based on the set bias current, and the result of detection of the offset light amount.

(4)
The driving device according to (2) or (3), in which the first driving currents are currents near a threshold current of the light-emitting element.

(5)
The driving device according to any one of (1) to (4), in which the setting section sets the target current higher than a linear segment in which emission intensity of the light-emitting element changes substantially linearly with respect to the driving current on the basis of multiple second sample light amounts and the result of detection of the offset light amount, the detection being performed by the light-receiving element, the multiple second sample light amounts being amounts of light in a case where the light-emitting element is caused to emit light by respective second driving currents having different values higher than the linear segment.

(6)
The driving device according to (5), in which the setting section detects abnormality of the target current on the basis of a result of detection of a second test light amount by the light-receiving element in a case where the light-emitting element is caused to emit light by a driving current based on the set target current.

(7)
The driving device according to (6), in which
the light-receiving element receives return light reflected by a diffusing member that diffuses the output light, and
the setting section detects abnormality of the diffusing member on the basis of the result of detection of the offset light amount and the result of detection of the second test light amount.

(8)
The driving device according to any one of (1) to (7), in which the output controller controls an output of a driving current in which the target current and the bias current are added up.

(9)
The driving device according to any one of (1) to (8), in which measurement of a distance to an object is made by using the output light, and the setting section sets, before the measurement of the distance, at least one of the bias current or the target current on the basis of the result of detection of the offset light amount.

(10)
The driving device according to any one of (1) to (9), in which the light-receiving element receives return light that is the output light returning by being reflected by a certain member.

(11)
The driving device according to any one of (1) to (10), in which the output controller includes a current mirror circuit having a variable current mirror ratio, and controls an output of a driving current in which an output current of the current mirror circuit and the bias current are added up.

(12)
The driving device according to (11), in which the current mirror ratio is reduced when an output of the output current is started.

(13)
The driving device according to (11) or (12), in which the current mirror ratio is reduced after passage of a predetermined delay time from the start of the output of the output current.

(14)
The driving device according to (13), in which the delay time is variable.

(15)
The driving device according to (13) or (14), in which
a shunt circuit that is able to be coupled to an output stage of the current mirror circuit is provided, and
the shunt circuit is coupled to the output stage until the passage of the delay time from the start of the output of the output current, and is separated from the output stage after the passage of the delay time.

(16)
The driving device according to (15), in which
a resistance of the shunt circuit includes an on-resistance of a field-effect transistor, and
a gate voltage of the field-effect transistor linearly changes with an input current of the current mirror circuit.

(17)
The driving device according to any one of (11) to (16), in which
an input stage of the current mirror circuit includes multiple transistors, and
the current mirror ratio changes depending on whether the multiple transistors are ON or OFF state.

(18)
The driving device according to (17), in which
some of the multiple transistors are OFF before start of the output of the output current, and
at least some of the transistors being OFF are turned ON at the start of the output of the output current or after passage of a predetermined delay time from the start of the output of the output current.

(19)
A driving method implemented by a driving device, the driving method comprising:
setting at least one of a bias current of a light-emitting element or a target current for setting output light from the light-emitting element to desired intensity on the basis of a result of detection of an offset light amount when the light-emitting element does not emit light, the detection being performed by a light-receiving element that receives a portion of the output light; and
controlling an output of a driving current of the light-emitting element on the basis of at least one of the set bias current or the set target current.

(20)
A light-emitting unit comprising:
a light-emitting element;
a light-receiving element that receives a portion of output light from the light-emitting element;
a setting section that sets at least one of a bias current of the light-emitting element or a target current for setting the output light to desired intensity on the basis of a result of detection of an offset light amount when the light-emitting element does not emit light, the detection being performed by the light-receiving element; and
an output controller that controls an output of a driving current of the light-emitting element on the basis of at least one of the set bias current or the set target current.

It is to be noted that the effects described in the present specification are merely an example and not limitative, and there may be other effects.

REFERENCE SIGNS LIST 100 ranging module
101 light emitter
112 optical module
113 LDD
115 range image sensor
116 LSI
121 LD
122 PD
123 diffuser
151 ADC
152 driver
161 setting section
162, 163 IDAC
164 output controller
171 power source
201 controller
211 APC executing section
212 ranging controller
401 switching current generating circuit
412 current source
413a to 413c transistor
414a to 414c switch
416 transistor
417 switch
434 parasitic inductance
451 switching current generating circuit
461 variable resistance
462 switch
501 switching current generating circuit
511 resistance
512 transistor
551 switching current generating circuit
561 switch

The invention claimed is:

1. A driving device comprising:
setting circuitry configured to set at least one of a bias current of a light-emitting element or a target current for setting output light from the light-emitting element to desired intensity on a basis of a result of detection of an offset light amount when the light-emitting element does not emit light, the detection being performed by a light-receiving element that receives a portion of the output light; and
an output controller configured to control an output of a driving current of the light-emitting element on a basis of at least one of the set bias current or the set target current wherein
the output controller includes a current mirror circuit having a variable current mirror ratio, and controls an output of a driving current in which an output current of the current mirror circuit and the bias current are added up, and
the current mirror ratio is reduced when an output of the output current is started.

2. The driving device according to claim 1, wherein
the setting circuitry sets the bias current on a basis of multiple first sample light amounts and the result of detection of the offset light amount by the light-receiving element, the multiple first sample light amounts comprising amounts of light in a case where the light-emitting element is caused to emit light by respective first driving currents having different values within a linear segment in which emission intensity of the light-emitting element changes substantially linearly with respect to the driving current.

3. The driving device according to claim 2, wherein
the setting circuitry detects abnormality of the bias current on a basis of a result of detection of a first test light amount by the light-receiving element in a case where the light-emitting element is caused to emit light by a driving current based on the set bias current, and the result of detection of the offset light amount.

4. The driving device according to claim 2, wherein the first driving currents comprise currents near a threshold current of the light-emitting element.

5. The driving device according to claim 1, wherein
the setting circuitry sets the target current higher than a linear segment in which emission intensity of the light-emitting element changes substantially linearly with respect to the driving current on a basis of multiple second sample light amounts and the result of detection of the offset light amount, the detection being performed by the light-receiving element, the multiple second sample light amounts comprising amounts of light in a case where the light-emitting element is caused to emit light by respective second driving currents having different values higher than the linear segment.

6. The driving device according to claim 5, wherein
the setting circuitry detects abnormality of the target current on a basis of a result of detection of a second test light amount by the light-receiving element in a case where the light-emitting element is caused to emit light by a driving current based on the set target current.

7. The driving device according to claim 6, wherein
the light-receiving element receives return light reflected by a diffusing member that diffuses the output light, and
the setting circuitry detects abnormality of the diffusing member on a basis of the result of detection of the offset light amount and the result of detection of the second test light amount.

8. The driving device according to claim 1, wherein
the output controller controls an output of a driving current in which the target current and the bias current are added up.

9. The driving device according to claim 1, wherein
measurement of a distance to an object is made by using the output light, and
the setting circuitry sets, before the measurement of the distance, at least one of the bias current or the target current on a basis of the result of detection of the offset light amount.

10. The driving device according to claim 1, wherein
the light-receiving element receives return light that comprises the output light returning by being reflected by a certain member.

11. The driving device according to claim 1, wherein an input stage of the current mirror circuit includes multiple transistors, and the current mirror ratio changes depending on whether the multiple transistors are ON or OFF state.

12. The driving device according to claim 11, wherein
some of the multiple transistors are OFF before start of the output of the output current, and
at least some of the transistors being OFF are turned ON at the start of the output of the output current or after passage of a predetermined delay time from the start of the output of the output current.

13. A light-emitting unit comprising the driving device according to claim 1.

14. A driving device comprising:
setting circuitry configured to set at least one of a bias current of a light-emitting element or a target current for setting output light from the light-emitting element to desired intensity on a basis of a result of detection of an offset light amount when the light-emitting element does not emit light, the detection being performed by a light-receiving element that receives a portion of the output light; and
an output controller configured to control an output of a driving current of the light-emitting element on a basis of at least one of the set bias current or the set target current, wherein
the output controller includes a current mirror circuit having a variable current mirror ratio, and controls an output of a driving current in which an output current of the current mirror circuit and the bias current are added up, and
the current mirror ratio is reduced after passage of a predetermined delay time from the start of the output of the output current.

15. The driving device according to claim 14, wherein the delay time is variable.

16. The driving device according to claim 14, further comprising:
a shunt circuit configured to be coupled to an output stage of the current mirror circuit is provided, wherein
the shunt circuit is coupled to the output stage until the passage of the delay time from the start of the output of the output current, and is disconnected from the output stage after the passage of the delay time.

17. The driving device according to claim 16, wherein
a resistance of the shunt circuit includes an on-resistance of a field-effect transistor, and
a gate voltage of the field-effect transistor linearly changes with an input current of the current mirror circuit.

18. A light-emitting unit comprising the driving device according to claim 14.

19. A driving method implemented by a driving device, the driving method comprising:
setting at least one of a bias current of a light-emitting element or a target current for setting output light from the light-emitting element to desired intensity on a basis of a result of detection of an offset light amount when the light-emitting element does not emit light, the detection being performed by a light-receiving element that receives a portion of the output light; and
controlling an output of a driving current of the light-emitting element on a basis of at least one of the set bias current or the set target current wherein
controlling the output of the driving current uses a current mirror circuit having a variable current mirror ratio, and controls an output of a driving current in which an output current of the current mirror circuit and the bias current are added up, and
the current mirror ratio is reduced when an output of the output current is started.

* * * * *